(12) United States Patent
Liu et al.

(10) Patent No.: US 12,506,099 B2
(45) Date of Patent: Dec. 23, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan (TW); Chih-Wei Wu, Yilan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 391 days.

(21) Appl. No.: 18/327,831

(22) Filed: Jun. 1, 2023

(65) Prior Publication Data

US 2024/0404971 A1 Dec. 5, 2024

(51) Int. Cl.
*H01L 23/00* (2006.01)
*H01L 23/31* (2006.01)
(Continued)

(52) U.S. Cl.
CPC .......... *H01L 24/16* (2013.01); *H01L 23/3135* (2013.01); *H01L 23/49811* (2013.01);
(Continued)

(58) Field of Classification Search
CPC .............. H01L 24/16; H01L 23/3135; H01L 23/49811; H01L 23/49822; H01L 24/13; H01L 24/17; H01L 24/29; H01L 24/32; H01L 24/73; H01L 25/0652; H01L 25/0655; H01L 25/105; H01L 2224/13083; H01L 2224/1357; H01L 2224/16145; H01L 2224/16225; H01L 2224/1703;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 200849527 12/2008
TW 200939417 9/2009
(Continued)

OTHER PUBLICATIONS

"Office Action of Taiwan Counterpart Application", issued on May 8, 2024, p. 1-p. 6.

*Primary Examiner* — Douglas W Owens
(74) *Attorney, Agent, or Firm* — JCIPRNET

(57) ABSTRACT

A semiconductor package and a manufacturing method thereof are provided. The semiconductor package includes a first device die; a second device die, stacked on the first device die; and first electrical connectors and second electrical connectors, disposed in between the first and second device dies. A first pitch between the first electrical connectors is greater than a second pitch between the second electrical connectors. The first and second electrical connectors respectively comprise a solder joint and first metallic layers lying at opposite sides of the solder joint and formed of a first metallic material. Each of the second electrical connectors further comprises at least one second metallic layer formed of a second metallic material.

20 Claims, 36 Drawing Sheets

(51) Int. Cl.
*H01L 23/498* (2006.01)
*H01L 25/065* (2023.01)
*H01L 25/10* (2006.01)

(52) U.S. Cl.
CPC ........ *H01L 23/49822* (2013.01); *H01L 24/13* (2013.01); *H01L 24/17* (2013.01); *H01L 24/29* (2013.01); *H01L 24/32* (2013.01); *H01L 24/73* (2013.01); *H01L 25/0652* (2013.01); *H01L 25/0655* (2013.01); *H01L 25/105* (2013.01); *H01L 2224/13083* (2013.01); *H01L 2224/13147* (2013.01); *H01L 2224/1357* (2013.01); *H01L 2224/16145* (2013.01); *H01L 2224/16225* (2013.01); *H01L 2224/1703* (2013.01); *H01L 2224/2919* (2013.01); *H01L 2224/32145* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/381* (2013.01)

(58) Field of Classification Search
CPC ... H01L 2224/2919; H01L 2224/32145; H01L 2224/32225; H01L 2224/73204; H01L 2225/1023; H01L 2225/1041; H01L 2225/1058; H01L 2924/381; H01L 2225/06541; H01L 24/05; H01L 2225/06517; H01L 23/3128; H01L 23/49816; H01L 25/0657; H01L 2225/06513; H01L 24/81; H01L 24/92; H01L 25/50
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,222,871 | B2 * | 1/2022 | Yang ........................ H01L 24/06 |
| 11,990,443 | B2 * | 5/2024 | Huang .............. H01L 23/49827 |
| 12,237,288 | B2 * | 2/2025 | Huang .................... H01L 24/17 |
| 2015/0235934 | A1 * | 8/2015 | Wu .................... H01L 23/49811 257/777 |
| 2018/0033775 | A1 * | 2/2018 | Liu ........................ H01L 25/105 |
| 2022/0093556 | A1 * | 3/2022 | Sakuma .............. H01L 21/4853 |
| 2022/0199562 | A1 * | 6/2022 | Waidhas ................ H01L 24/17 |
| 2023/0067349 | A1 * | 3/2023 | Lin ........................ H01L 25/50 |
| 2024/0120305 | A1 * | 4/2024 | Ecton .................. H01L 23/5381 |

FOREIGN PATENT DOCUMENTS

| | | | | |
|---|---|---|---|---|
| TW | 202015211 | | 4/2020 | |
| WO | WO-2019132967 A1 | * | 7/2019 | ............. H01L 23/42 |

* cited by examiner

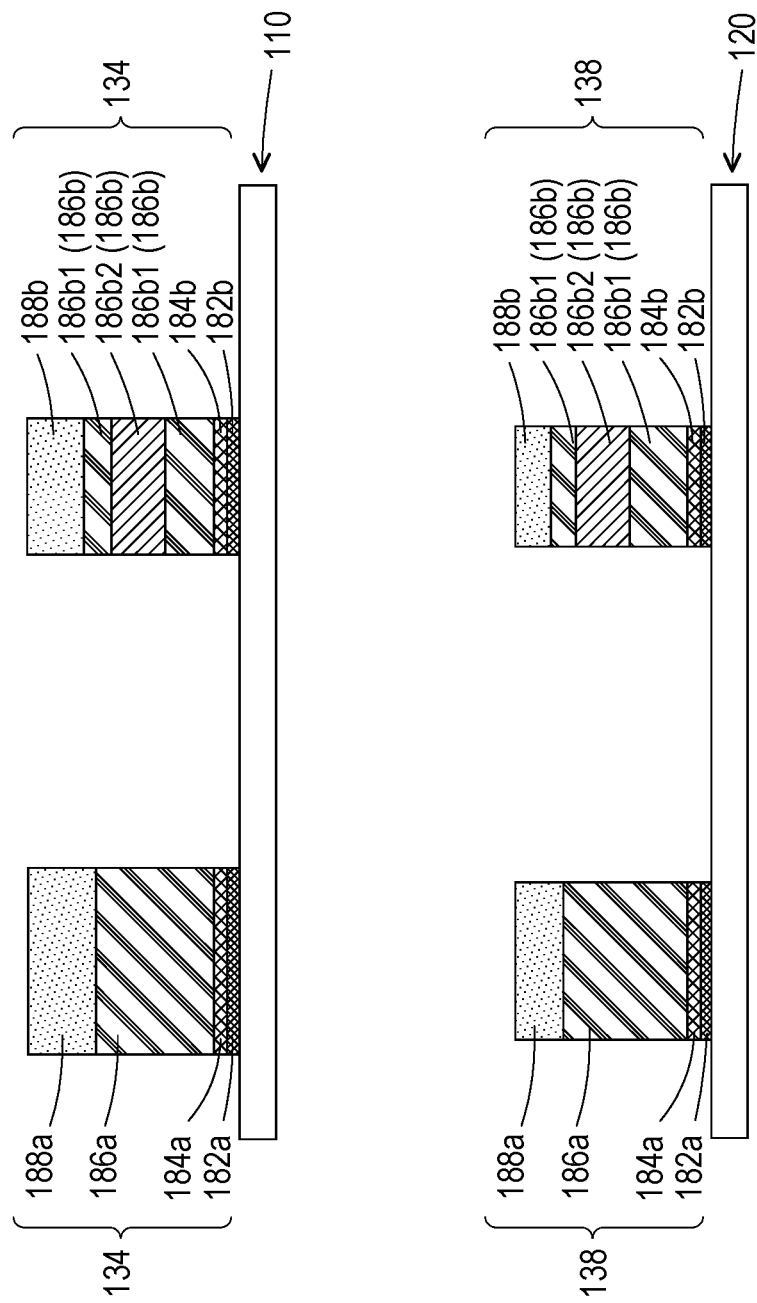

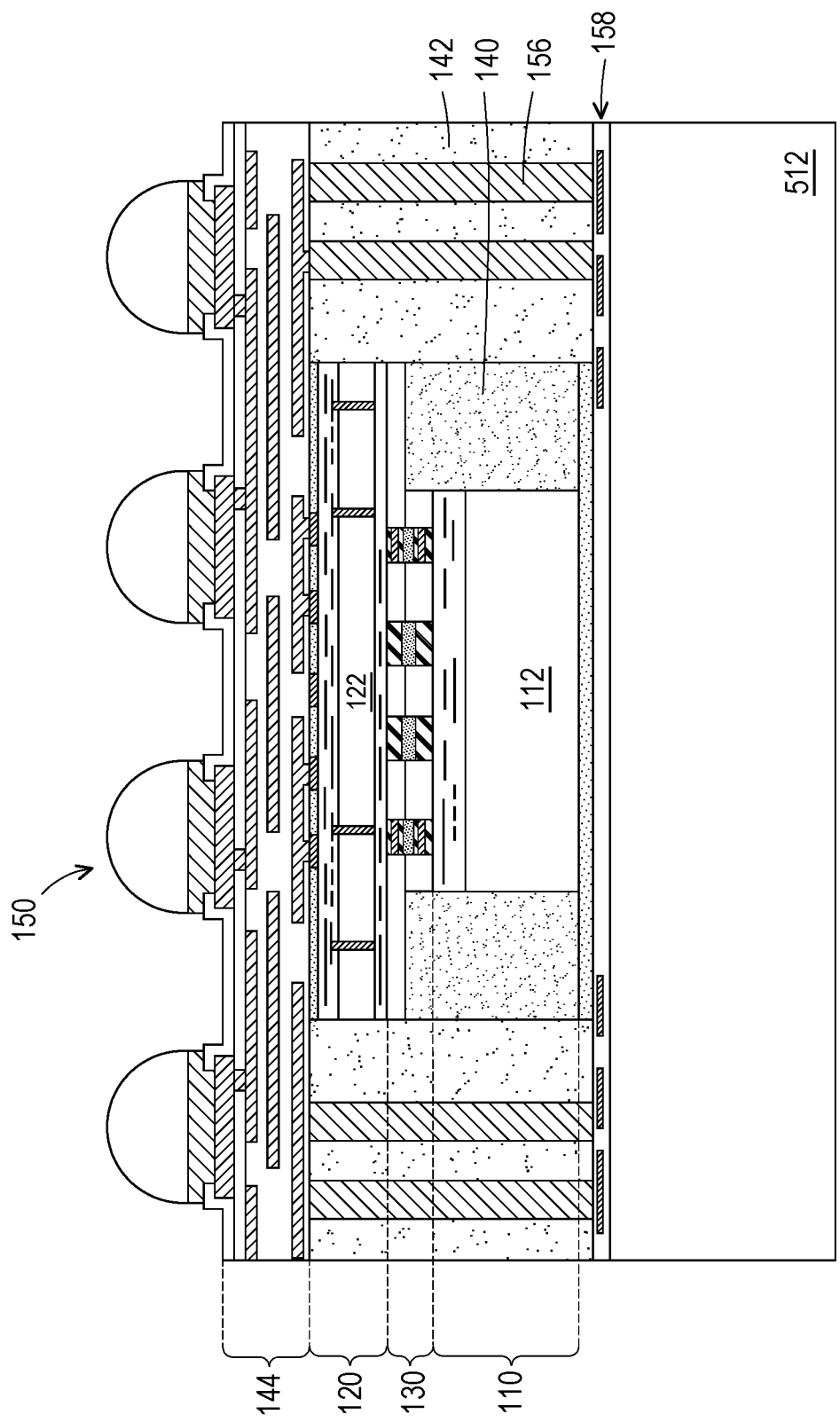

SEMICONDUCTOR PACKAGE AND MANUFACTURING METHOD THEREOF

BACKGROUND

Semiconductor industry has strived to continually reduce feature size and power consumption of various electronic components, while on the other hand increasing device density, wire density and operation frequency of the electronic components. These advanced electronic components also require smaller packages that utilize less area than packages of the past.

Three dimensional integrated circuit (3DIC) is a recent development in semiconductor packaging in which multiple dies are stacked upon one another. 3DIC provides improved integration density and other advantages, such as greater operation speed and higher bandwidth, because of the decreased length of interconnects between the stacked dies. However, there are quite a few challenges to be overcome for the technology of 3DICs. For instance, bumps configured to connect vertically separated dies in a 3DIC may suffer from low reliability, especially for ones formed with rather short pitch.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 3F are schematic cross-sectional views illustrating structures at various stages during the method shown in FIG. 2.

FIG. 5A through FIG. 5J are schematic cross-sectional views illustrating intermediate structures at various stages during the process shown in FIG. 4.

DETAILED DESCRIPTION

Figure 1A:
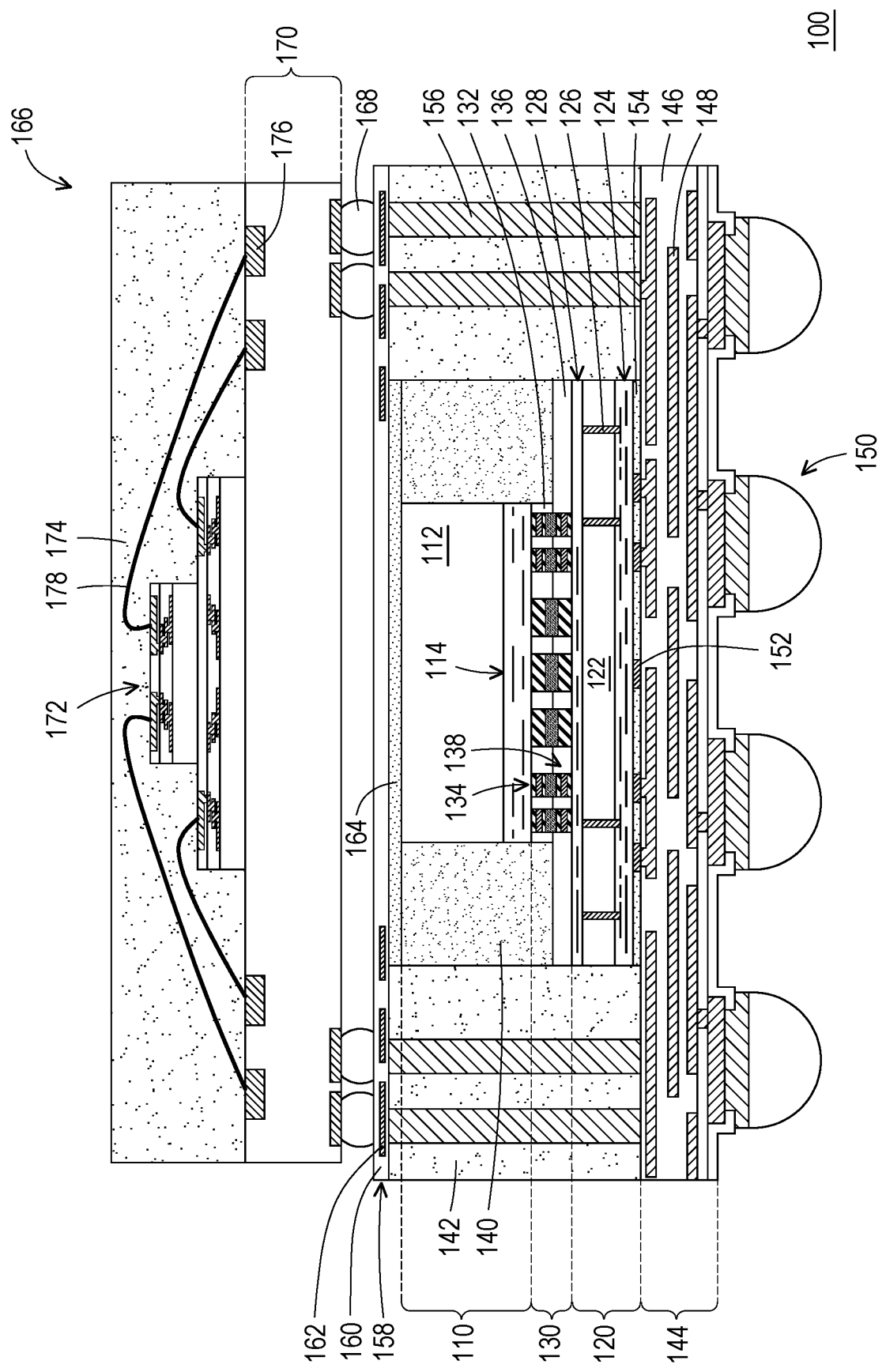
FIG. 1A is a schematic cross-sectional view illustrating a semiconductor package, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view illustrating a semiconductor package 100, according to some embodiments of the present disclosure.

Referring to FIG. 1A, the semiconductor package 100 includes device dies 110, 120 with the same or different function(s), and electrically connected to each other. The device die 110 is stacked on the device die 120 via a face-to-back manner. That is, an active side of the device die 110 faces toward a back side of the underlying device die 120. In some embodiments, the bottom device die 120 is greater in size as compared to the top device die 110.

The top device die 110 includes a semiconductor substrate 112, and active devices (not shown) are formed on an active side of the semiconductor substrate 112. Further, the top device die 110 also includes metallization layers 114 stacked on the active side of the semiconductor substrate 112, for routing the active devices. The active side of the top device die 110 facing toward the bottom device die 120 may be defined by a side of the metallization layers 114 facing away from the semiconductor substrate 112. On the other hand, a back side of the top device die 110 may be defined by a side of the semiconductor substrate 112 facing away from the metallization layers 114.

Similarly, the bottom device die 120 includes a semiconductor substrate 122, and active devices (not shown) may be formed on an active side of the semiconductor substrate 122. In addition, the bottom device die 120 includes front metallization layers 124 stacked on the active side of the semiconductor substrate 122, for routing the active devices. Further, the bottom device die 120 includes through substrate vias 126 extending through the semiconductor substrate 122 from a back side of the semiconductor substrate 122, and includes back metallization layers 128 covering the back side of the semiconductor substrate 122 and configured to rout the through substrate vias 126. The back side of the bottom device die 120 facing toward the top device die 110 may be defined by a side of the back metallization layers 128 opposite to the semiconductor substrate 122. On the other hand, an active side of the bottom device die 120 may be defined by a side of the front metallization layers 124 facing away from the semiconductor substrate 122.

The top and bottom device dies 110, 120 are bonded with each other via polymer-to-polymer bonding and solder-to-solder jointing. Specifically, a bonding layer 130 including a polymer layer 132 and contact features 134 filled in openings of the polymer layer 132 is formed along the active side of the top device die 110, and another bonding layer 130 including a polymer layer 136 and contact features 138 filled in openings of the polymer layer 136 is formed along the back side of the bottom device die 120. Further, as polymer-to-polymer bonding, the top polymer layer 132 is bonded with the bottom polymer layer 136. In addition, as solder-to-solder jointing, the top contact features 134 are jointed with the bottom contact features 138, respectively. As a result, stacks of the contact features 134, 138 form electrical connectors functioned as vertical conduction paths extending between the top and bottom device dies 110, 120. As the top polymer layer 132 may be patterned during singulation of the top device die 110, sidewalls of the polymer layer 132 may be substantially coplanar with sidewalls of the metallization layers 114 and the semiconductor substrate 112 of the top device die 110. Similarly, the bottom polymer layer 136 may be patterned during singulation of the bottom device die 120, thus sidewalls of the polymer layer 136 may be substantially coplanar with sidewalls of the back metallization layers 128, the semiconductor substrate 122 and the front metallization layers 124 of the bottom device die 120. As will be further described with reference to FIG. 1B, some of the electrical connectors each including one of the top contact features 134 and the overlapping bottom contact feature 138 are formed with a first critical width and a first pitch, while others of the electrical connectors are formed with a second critical width and a second pitch.

Further, the top and bottom devices 110, 120 are encapsulated in the semiconductor package 100. Specifically, an encapsulant 140 is formed on the bottom polymer layer 136, and laterally encapsulates the top device die 110 and the top bonding layer 130 lining along the active side of the top device die 110. The encapsulant 140 may be patterned during singulation of the bottom device die 120, such that sidewalls of the encapsulant 140 may be substantially coplanar with the sidewalls of the bottom device die 120 (i.e., the sidewalls of the semiconductor substrate 122 as well as the front and back metallization layers 124, 128) and the sidewalls of the bottom polymer layer 136. Further, the encapsulated top device die 110, the bottom device die 120 and the bonding layers 130 lining in between are laterally encapsulated by an encapsulant 142. Accordingly, the encapsulant 140 surrounding the top device die 110, the polymer layers 130, 134 of the bonding layers 130 and the bottom device die 120 are in lateral contact with the encapsulant 142.

Moreover, the bonded device dies 110, 120 are further routed, so as to be communicated with external components. Specifically, a bottom redistribution structure 144 including a stack of dielectric layers 146 and conductive features 148 spreading in the stack of the dielectric layers 146 may be formed along a bottom side of the encapsulant 140 and the active side of the bottom device die 120, and the conductive features 148 are designed to out-rout the bottom device die 122 to another side of the bottom redistribution structure 144. Conductive bumps 150 disposed at the side of the bottom redistribution structure 144 facing away from the bottom device die 120 may be functioned as package input/output (I/O) terminals to be engaged with components external to the semiconductor package 100. In some embodiments, the conductive features 148 in the bottom redistribution structure 144 are connected to conductive features in the front metallization layers 124 of the bottom device die 120 through contacts 152 formed in a dielectric layer 154 lining along a side of the front metallization layers 124. In these embodiments, sidewalls of the dielectric layer 154 may be substantially coplanar with the sidewalls of the front metallization layers 124, the semiconductor substrate 122, the back metallization layers 128 of the bottom device die 120, and may be in lateral contact with the encapsulant 142.

In further embodiments, the bonded device dies 110, 120 are also routed to a side of the encapsulant 142 facing away from the bottom redistribution structure 144. In these embodiments, through encapsulant vias 156 may be disposed around the bonded device dies 110, 120 on the bottom redistribution structure 144, and extend through the encapsulant 142 to reach a top side of the encapsulant 142. In this way, the conductive features 148 in the bottom redistribution structure 144 can be routed to the top side of the encapsulant 142 along vertical conduction paths established by the through encapsulant vias 156. In addition, a top redistribution structure 158 including one or more dielectric layer(s) 160 and conductive features 162 spreading in the dielectric layer(s) 160 may be formed along a top side of the encapsulants 138, 142 and the back side of the top device die 110, and the conductive features 162 are deployed to out-rout the through encapsulant vias 156. In some embodiments, the encapsulant 138 and the top device die 110 are in contact with the top redistribution structure 158 through an adhesive film 164. In these embodiments, sidewalls of the adhesive film 164 may be substantially coplanar with the sidewalls of the encapsulant 138, and may be in lateral contact with the encapsulant 142.

According to some embodiments, a package component 166 is stacked on the top redistribution structure 158, and conductive bumps 168 disposed therebetween are configured to establish electrical connection between the package component 166 and the conductive features 162 in the top redistribution structure 158, such that the bonded device dies 110, 120 can be communicated with the package component 166 through the bottom redistribution structure 144, the through encapsulant vias 156, the top redistribution structure 158 and the conductive bumps 168. As an example, the package component 166 may include a circuit substrate 170, a stack of device dies 172 attached onto the circuit substrate 170 and an encapsulant 174 encapsulating the device dies 172. Further, the device dies 172 may be connected to conductive features 176 in the circuit substrate 170 via bonding wires 178, and may be routed to the conductive bumps 168 through the bonding wires 178 and the conductive features 176 in the circuit substrate 170. However, the package component 166 may be provided as another type of semiconductor package, the embodiments described with reference to FIG. 1A are not limited to any specific type of the package component 166.

As described, the device dies 110, 120 in the semiconductor package 100 are stacked along a vertical direction, rather than being placed side-by-side. Further, stacks of the contact features 134, 138 between the device dies 110, 120 can provide shortest conduction paths connecting one of the device dies 110, 120 to another. Among other improvements, better reliability of the electrical connectors formed by the stacks of contact features 134, 138 is ensured, as will be described in further details.

Figure 1B:
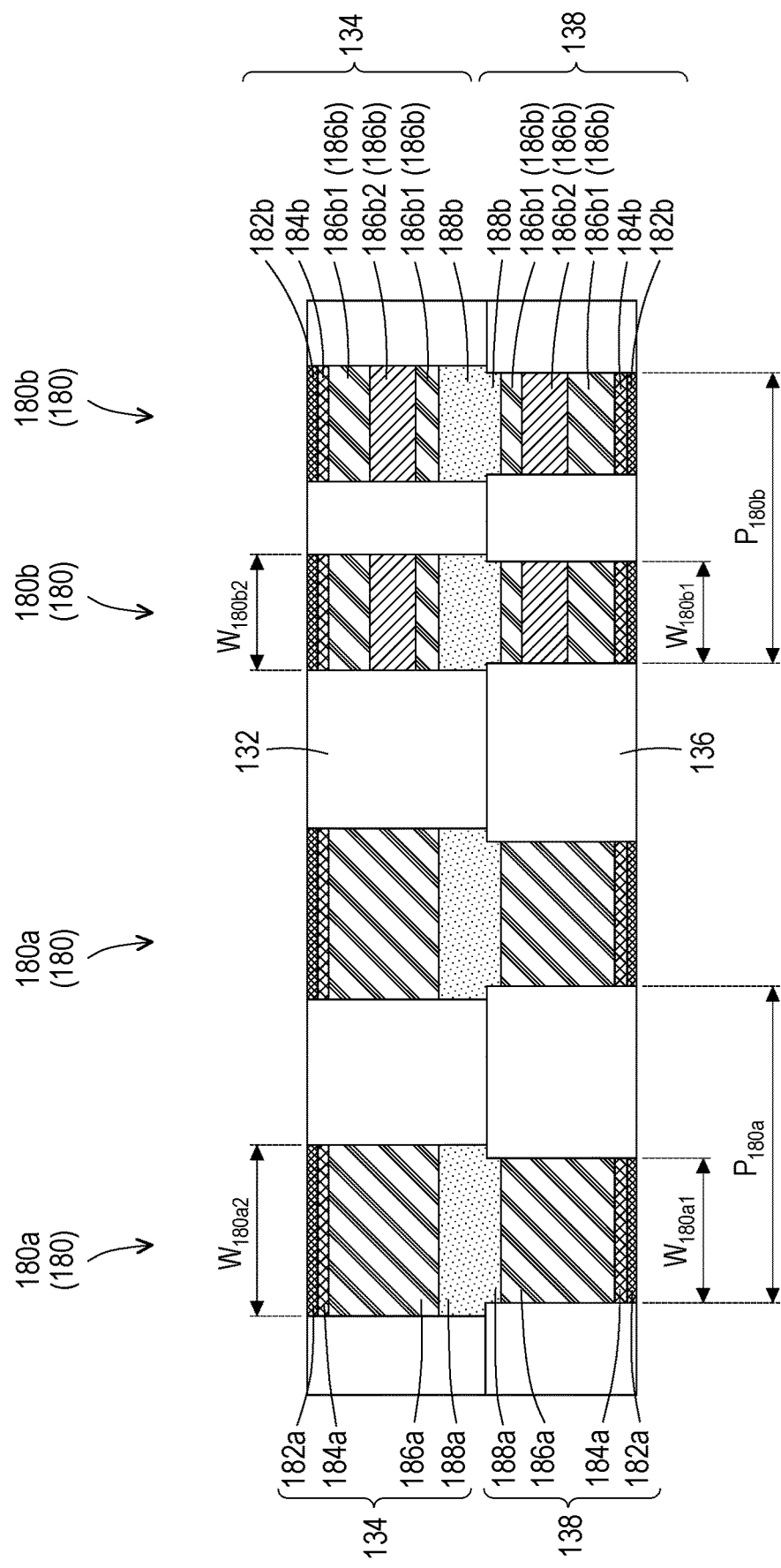
FIG. 1B is an enlarged cross-sectional view schematically illustrating stacks of contact features shown in FIG. 1A.

FIG. 1B is an enlarged cross-sectional view schematically illustrating the stacks of contact features 134, 138 shown in FIG. 1A.

Electrical connectors 180 each having an upper half provided by one of the contact features 134 and a lower half provided by one of the contact features 138 are formed in the polymer layers 132, 136 of the bonding layers 130. A first group of the electrical connectors 180 (referred to as electrical connectors 180a) are formed with a first pitch $P_{180a}$ and a first critical (shortest) width $W_{180a1}$, whereas a second group of the electrical connectors 108 (referred to as electrical connectors 180b) are formed with a second pitch $P_{180b}$ and a second critical (shortest) width $W_{180b1}$. The first pitch $P_{180a}$ is greater than the second pitch $P_{180b}$, and the first critical width $W_{180a1}$ is greater than the second critical width $W_{180b1}$. As an example, the first pitch $P_{180a}$ may range from 50 µm to 150 µm; the second pitch $P_{180b}$ may range from 5 µm to 25 µm; the first critical width $W_{180a1}$ may range from 35 µm to 85 µm; and the second critical width $W_{180b1}$ may range from 2.5 µm to 15 µm. The electrical connectors 180a, 180b may be designed with such dimensional difference for transmitting different types of signals. For instance, the electrical connectors 180a with greater pitch and greater critical width may be configured to transmit signals including power and ground signals, whereas the electrical connectors 180b with shorter pitch and shorter critical width may be configured to implement communication between the device dies 110, 120.

Owing to the dimensional difference between the electrical connectors 180a, 180b, the electrical connectors 180a, 180b are designed with different combinations of layers. In some embodiments, the upper and lower halves of each of the electrical connectors 180a, 180b are formed with identical layer design, and are symmetry (in terms of layer design) with respect to an interface therebetween. As an example, the contact feature 134 as the upper half of each electrical connector 180a and the contact feature 138 as the lower half of each electrical connector 180a may respectively include a stack of seed layers 182a, 184a, a metallic layer 186a formed from the seed layers 182a, 184a and a solder joint 188a covering the metallic layer 186a. Further, in each electrical connector 180a, the solder joint 188a, the metallic layer 186a and the seed layers 184a, 182a of the upper half as well as the solder joint 188a, the metallic layer 186a and the seed layers 184a, 182a of the lower half are sequentially arranged away from an interface between the upper and lower halves, and each electrical connector 180a is therefore symmetry (in terms of layer design) with respect to the interface between upper and lower halves. On the other hand, the contact feature 134 as the upper half of each electrical connector 180b and the contact feature 138 as the lower half of each electrical connector 180b may respectively include a stack of seed layers 182b, 184b, a stack of metallic layers 186b formed from the seed layers 182b, 184b and a solder joint 188b covering the stack of metallic layers 186b. In addition, in each electrical connector 180b, the solder joint 188b, the stack of metallic layers 186b and the seed layers 184a, 182a of the upper half as well as the solder joint 188b, the stack of metallic layers 186b and the seed layers 184a, 182a of the lower half are sequentially arranged away from an interface between the upper and lower halves, and each electrical connector 180b is therefore symmetry (in terms of layer design) with respect to the interface between upper and lower halves as well.

In this example, the metallic layers 186a in each electrical connector 180a may be formed of a first metallic material. In addition, the metallic layers 186b in either the upper half or the lower half of each electrical connector 180b may include a pair of first metallic layers 186b1 formed of the first metallic material, and include a second metallic layer 186b2 formed of a second metallic material sandwiched between the first metallic layers 186b1. The first metallic material is different from the second metallic material. For instance, the first metallic material may include copper, while the second metallic material may include nickel, cobalt, iron or combinations thereof. Intermetallic compound may prone to form at an interface between each solder joint 188a/188b and the covering metallic layer 186a/186b1 comprising the first metallic material, from a peripheral region of each electrical connector 180a/180b. Consequently, lateral recess may be resulted at intersection of such interface and a sidewall of each electrical connector 180a/180b, and may cause breaking or serious necking for the electrical connectors 180b, as the electrical connectors 180b are formed with shorter critical width. By further incorporating the metallic layers formed of the second metallic material (i.e., the metallic layers 186b2) in the electrical connectors 180b, the metallic layers 186b1 formed of the first metallic material and in contact with the solder joints 188b may be provided with a smaller thickness (as compared to a thickness of the metallic layers 186a in the electrical connectors 180a). That is, source for forming the intermetallic compound may be reduced in the electrical connectors 180b. Accordingly, the lateral recess of the electrical connectors 180b resulted from formation of intermetallic compound can be effectively suppressed. Therefore, the electrical connectors 180b can be effectively avoided from the breaking or the serious necking, and more promising communication between the device dies 110, 120 can be ensured.

As described, despite being formed of the same material (i.e., the first metallic material), the metallic layer 186b1 is thinner than the metallic layer 186a. In some embodiments, the metallic layer 186b2 is also thinner than the metallic layer 186a. As an example, the thickness of the metallic layer 186a may range from 8 µm to 12 µm; the thickness of the metallic layer 186b1 may range from 1 µm to 5 µm; and the thickness of the metallic layer 186b2 may range from 3 µm to 6 µm.

According to some embodiments, the upper and lower halves of each of the electrical connectors 180a, 180b may be slightly different from each other in terms of pattern width. For instance, the contact features 138 each providing the lower half of one of the electrical connectors 180a are formed with the first critical width $W_{180a1}$, whereas the contact features 134 each providing the upper half of one of the electrical connectors 180a are formed with a width $W_{180a2}$ slightly greater than the first critical width $W_{180a1}$. Similarly, the contact features 138 each providing the lower half of one of the electrical connectors 180b are formed with the second critical width $W_{180b1}$, whereas the contact features 134 each providing the upper half of one of the electrical connectors 180b are formed with a width $W_{180b2}$ slightly greater than the second critical width $W_{180b1}$. By designing each electrical connector 180a/180b with upper half slightly wider than lower half, tolerance of overlay accuracy for bonding the upper and lower halves can be increased, and sufficient contact area of the upper and lower halves can be ensured.

Moreover, as described, the contact features 134 each providing an upper half of one of the electrical connectors 180a, 180b are filled in openings of the polymer layer 132, and the contact features 138 each providing a lower half of one of the electrical connectors 180a, 180b are filled in openings of the polymer layer 136. As such, the solder joints 188a, 188b of the electrical connectors 180a, 180b are confined by the polymer layers 132, 136 from lateral protrusion during a possible thermal treatment during manufacturing. Therefore, unintended contact between adjacent electrical connectors 180a, 180b can be effectively avoided, especially for the electrical connectors 180b with shorter pitch.

Figure 2:
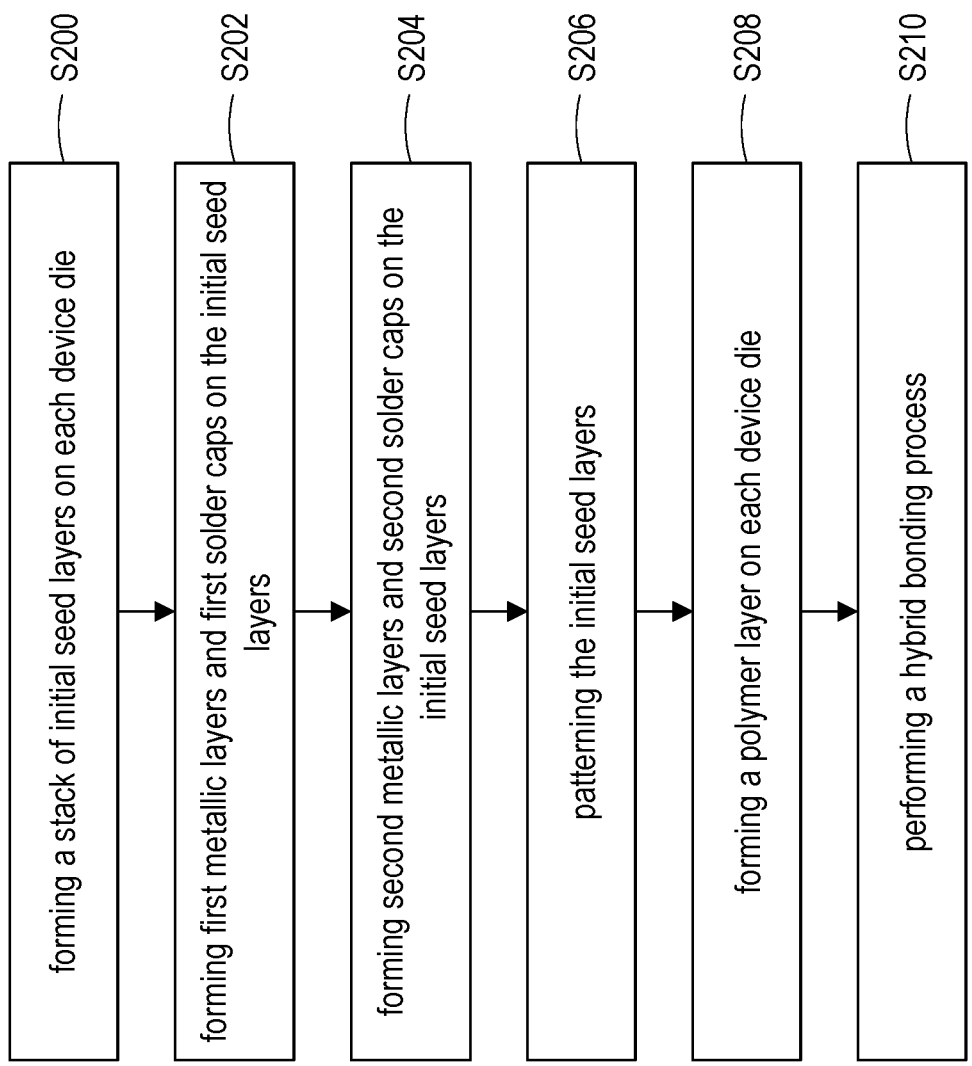
FIG. 2 is a flow diagram illustrating a method for forming respective bonding layers and combining the bonding layers during manufacturing of the semiconductor package shown in FIG. 1A, according to some embodiments of the present disclosure.

FIG. 2 is a flow diagram illustrating a method for forming the respective bonding layers 130 and combining the bonding layers 130, according to some embodiments of the present disclosure. FIG. 3A through FIG. 3F are schematic cross-sectional views illustrating structures at various stages during the method shown in FIG. 2.

Initially, the bonding layers 130 are formed on the device dies 110, 120, respectively. Although the bonding layers 130 are depicted as being formed simultaneously in a series of process steps, it should be appreciated that the bonding layers 130 may otherwise be formed sequentially. That is, the bonding layers 130 may be formed at the same time, or one of the bonding layers 130 may be formed after formation of the other one.

Figure 3A:
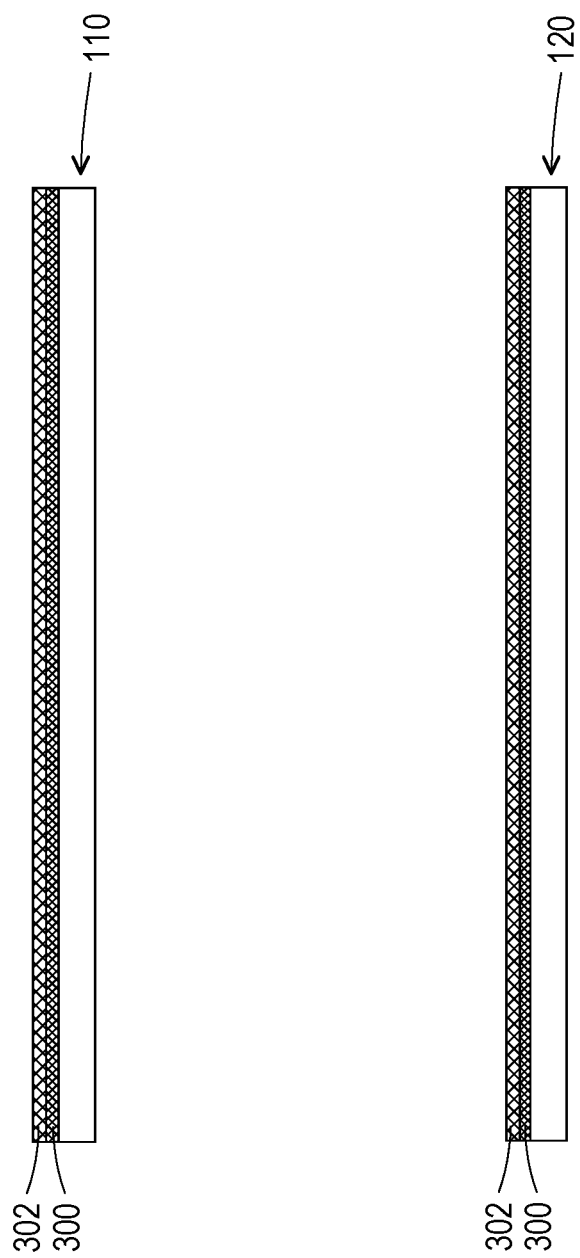

Referring to FIG. 2 and FIG. 3A, at a step S200, a stack of initial seed layers 300, 302 are formed on each of the device die 110 and the device die 120. Currently, the initial seed layers 300, 302 may entirely cover each of the device dies 110, 120. In a subsequent step, the initial seed layers 300, 302 will be patterned to form the seed layers 182a, 184a and the seed layers 182b, 184b on each of the device dies 110, 120.

Figure 3B:
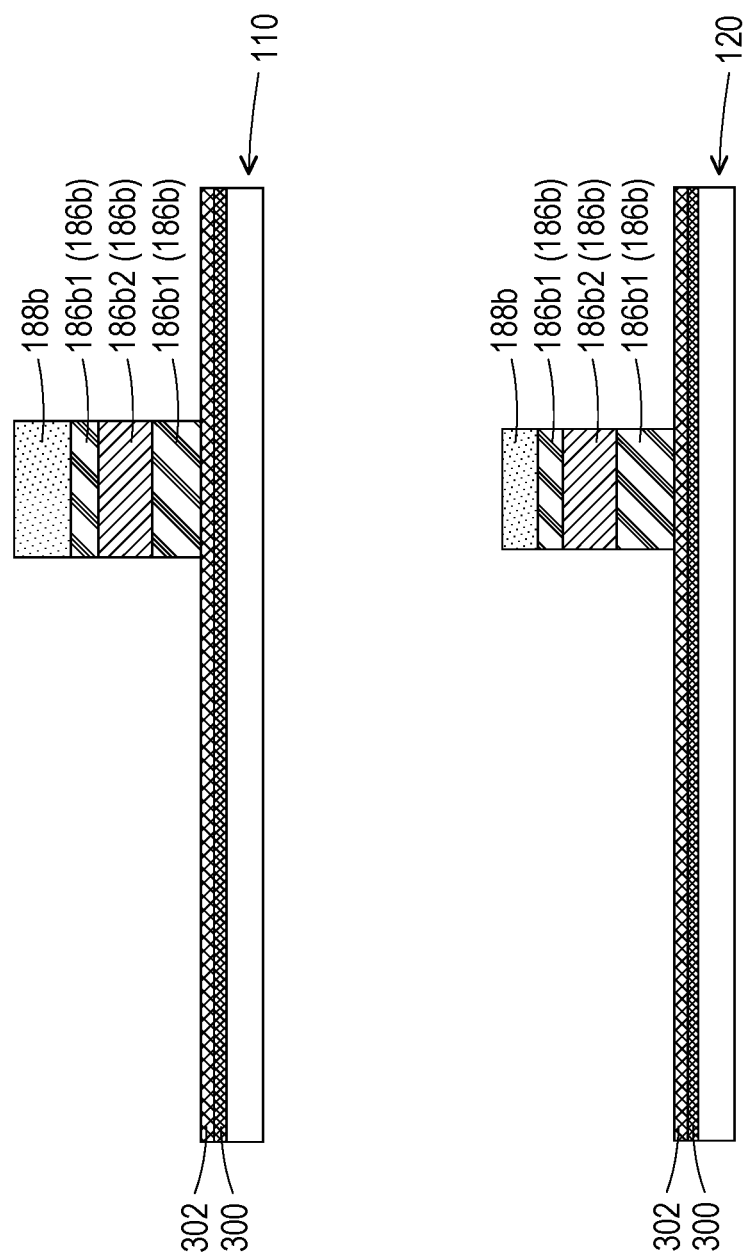

Referring to FIG. 2 and FIG. 3B, at a step S202, the metallic layers 186b and the solder joints 188b are formed from the initial seed layers 300, 302. Preliminarily, a mask pattern (not shown) having openings may be formed on the respective stack of initial seed layers 300, 302. In this way, the metallic layers 186b and the solder joints 188b are defined in the openings of the mask pattern on each of the device dies 110, 120. After formation of the metallic layers 186b and the solder joints 188b, the mask patterns may be removed. In some embodiments, the metallic layers 186b and the solder joints 188b on each of the device dies 110, 120 are formed by a series of plating processes.

Figure 3C:
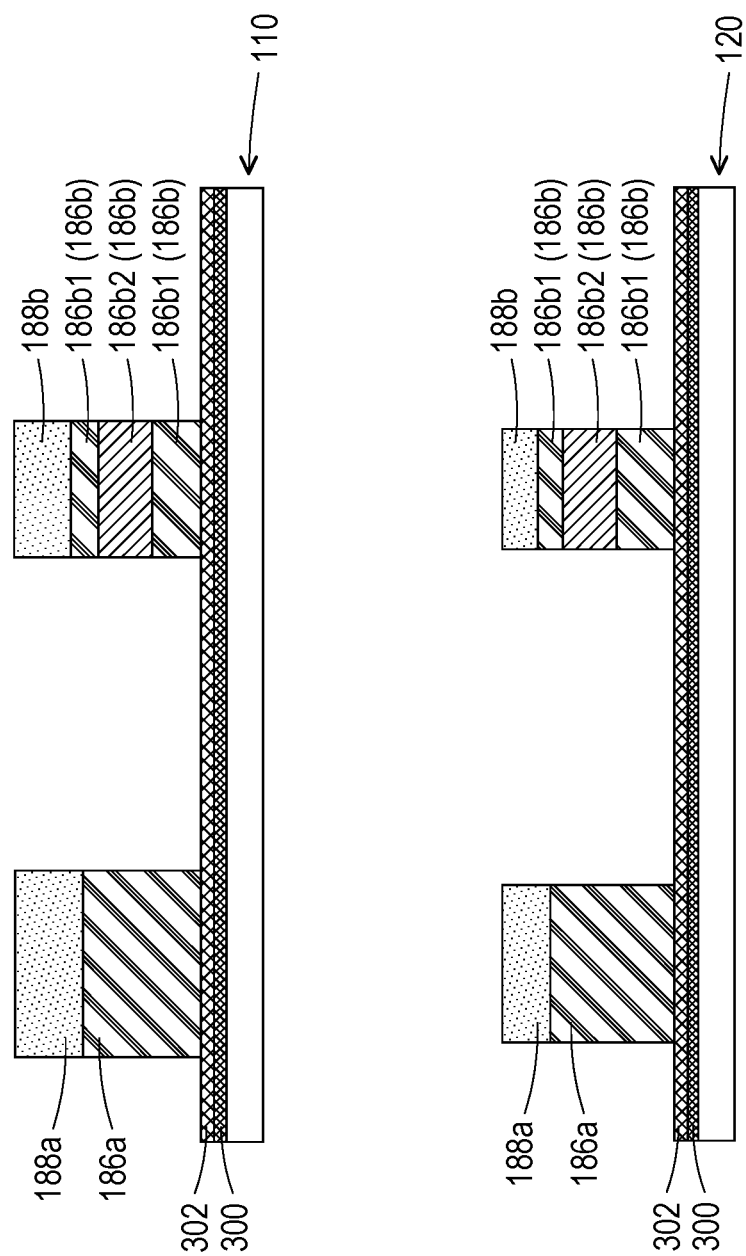

Referring to FIG. 2 and FIG. 3C, at a step S204, the metallic layers 186a and the solder joints 188a are formed from the initial seed layers 300, 302. Preliminarily, another mask pattern (not shown) having openings may be formed on the initial seed layers 300, 302 and cover the metallic layers 186b and the solder joints 186b on each of the device dies 110, 120. In this way, the metallic layers 186a and the solder joints 188a are defined in the openings of the mask pattern on each of the device dies 110, 120. After formation of the metallic layers 186a and the solder joints 188a, the mask patterns may be removed. In some embodiments, the metallic layers 186a and the solder joints 188a on each of the device dies 110, 120 are formed by a series of plating processes.

Referring to FIG. 2 and FIG. 3D, at a step S206, the initial seed layers 300, 302 on each of the device dies 110, 120 are patterned. Specifically, on each of the device dies 110, 120, portions of the initial seed layers 300, 302 not shielded by the stacks of the metallic layer 186a and the solder joint 188a as well as the stacks of the metallic layers 186b and the solder joint 188b are removed, and remained portions of the initial seed layers 300, 304 form the seed layers 182a, 184a and the seed layers 182b, 184b. Up to here, the contact features 134 each provided as an upper half of one of the electrical connectors 180a, 180b are formed on the device die 110, and the contact features 138 each provided as a lower half of one of the electrical connectors 180a, 180b are formed on the device die 120.

Figure 3E:
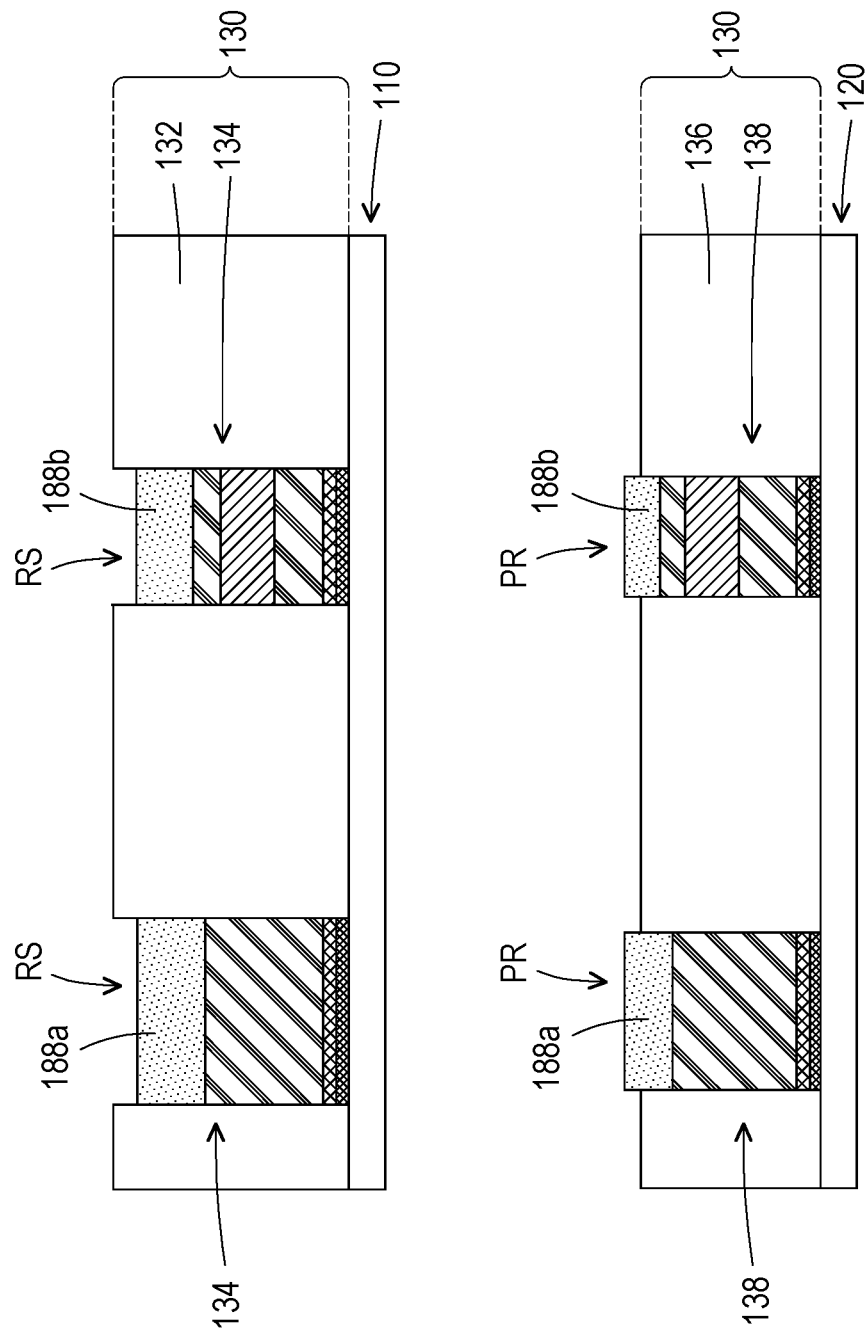

Referring to FIG. 2 and FIG. 3E, at a step S208, the polymer layers 132, 136 are formed on the device dies 110, 120, respectively. The polymer layer 132 laterally encloses the contact features 134 on the device die 110, while the polymer layer 136 laterally encloses the contact features 138 on the device die 120. According to some embodiments, the polymer layer 132 on the device die 110 is formed to a height greater than a height of the contact features 134, and is etched back to reveal the solder joints 188a. 188b of the contact features 134. As a result, recess RS are defined at a bonding surface of the bonding layer 130 including the contact features 134 and the polymer layer 132. In addition, the polymer layer 136 on the device die 120 may be recessed, such that the solder joints 188a, 188b of the contact features 138 are protruded from a top surface of the polymer layer 136, and protrusions PR are defined at a bonding surface of the bonding layer 130 including the contact features 138 and the polymer layer 136.

Figure 3F:
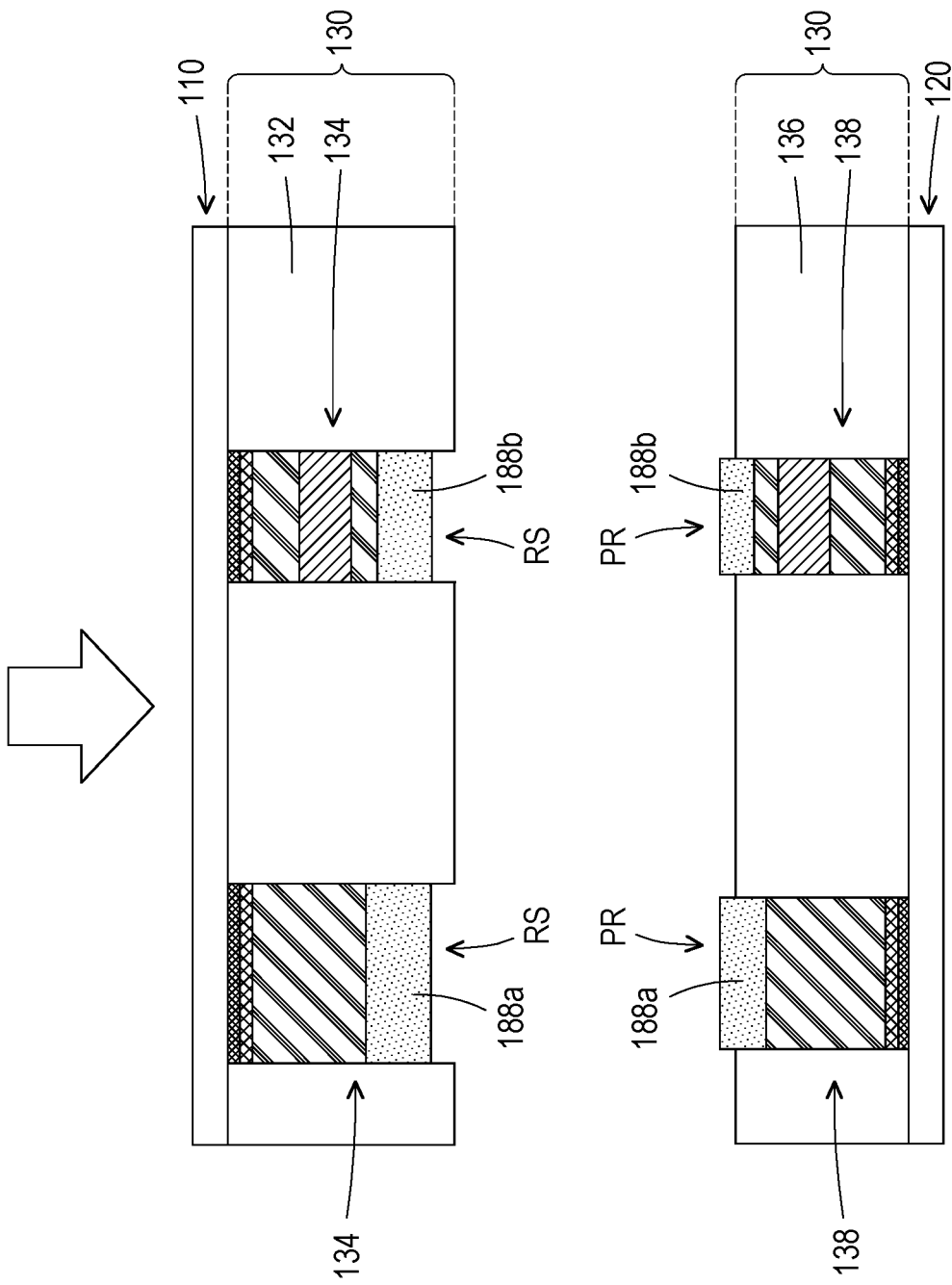

Referring to FIG. 2 and FIG. 3F, at a step S210, the bonding layer 130 on the device die 110 is bonded with the bonding layer 130 on the device die 120. Preliminarily, one of the device dies 110, 120 may be flipped over and placed onto the other. As a result, the polymer layers 132, 136 are in contact with each other, and the protrusions PR protruding from the polymer layer 136 are inserted into the recess RS recessed from the polymer layer 132, respectively. Subsequently, a thermal treatment is performed. As a result, the polymer layers 132, 136 are bonded with each other, and the solder joints 188a, 188b defining the protrusions PR are jointed with the solder joints 188a, 188b exposed in the recesses RS. Further, a thermal treatment may be subsequently performed, such that the solder joints 188a, 188b may reflow, and the recesses RS may be completely filled by the solder joints 188a, 188b.

As described, on each of the device dies 110, 120, the metallic layers 186b and the solder joints 188b of the electrical connectors 180b are formed before formation of the metallic layers 186a and the solder joints 188a of the electrical connectors 180a. However, in other embodiments, the metallic layers 186b and the solder joints 188b of the electrical connectors 180b are otherwise formed after formation of the metallic layers 186a and the solder joints 188a of the electrical connectors 180a on each of the device dies 110, 120. In either case, the metallic layers 186b and the solder joints 188b on each of the device dies 110, 120 are formed by a first series of plating processes, while the metallic layers 186a and the solder joints 188a on each of the device dies 110, 120 are formed by a second series of plating processes before or after the first series of plating processes. Since the electrical connectors 180b are designed with a shorter critical width as compared to the electrical connectors 180a, current density provided during the first series of plating processes may be lower than current density provided during the second series of plating processes. In order to compensate such difference in current density, process time of the first series of plating processes may be adjusted to be longer than process time of the second series of plating processes, such that a height of the contact features 134, 138 containing the metallic layers 186b and the solder joints 188b would not be much shorter than a height of the contact features 134, 138 containing the metallic layers 186a and the solder joints 188a. If same series of plating processes are used for forming the metallic layers 186a, 186b and the solder joints 188a, 188b on each of the device dies 110, 120, the contact features 134, 138 containing the metallic layers 186b and the solder joints 188b may be resulted as being much shorter than the contact features 134, 138 containing the metallic layers 186a and the solder joints 188a, and these shorter contact features 134, 138 may fail to make contact during the bonding step. In other words, by using separate series of plating process for forming the contact features 134/138 for both of the electrical connectors 180a, 180b on each of the device dies 110, 120, promising reliability of the electrical connectors 180a, 180b (especially the electrical connectors 180b) can be ensured.

Figure 4:
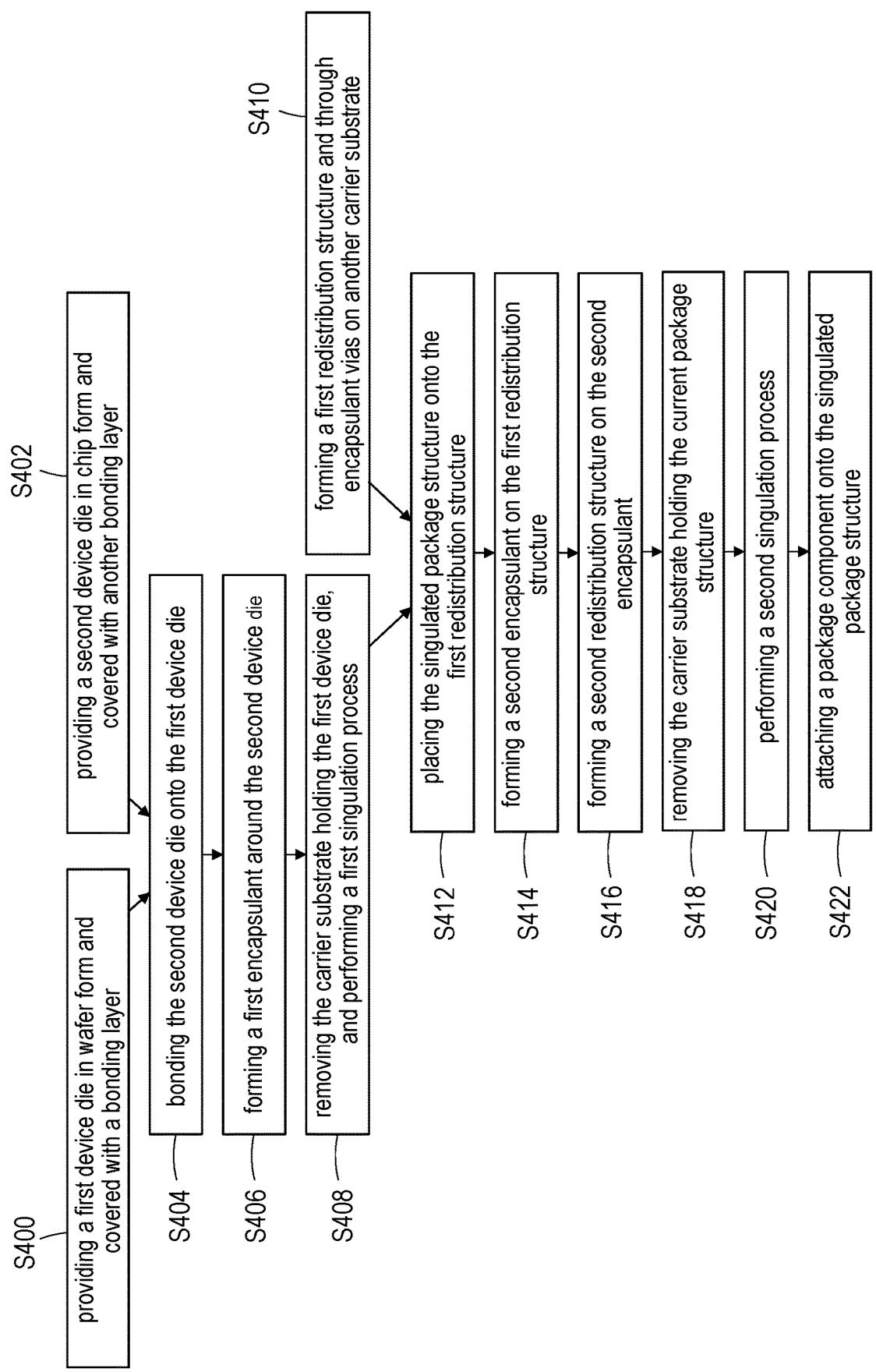
FIG. 4 is a flow diagram illustrating an overall process for forming the semiconductor package as shown in FIG. 1A, according to some embodiments of the present disclosure.

FIG. 4 is a flow diagram illustrating an overall process for forming the semiconductor package 100 as shown in FIG. 1A, according to some embodiments of the present disclosure. FIG. 5A through FIG. 5J are schematic cross-sectional views illustrating intermediate structures at various stages during the process shown in FIG. 4.

Figure 5A:
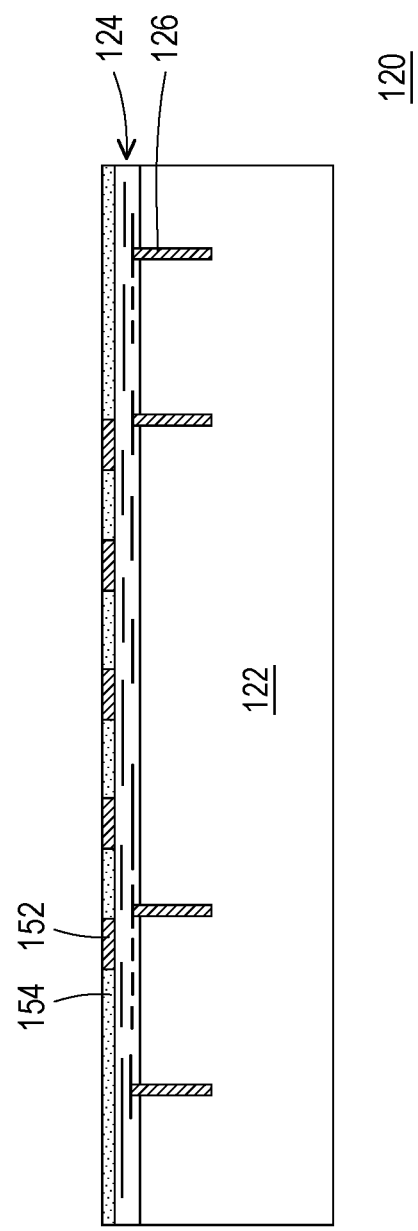
Figure 5B:
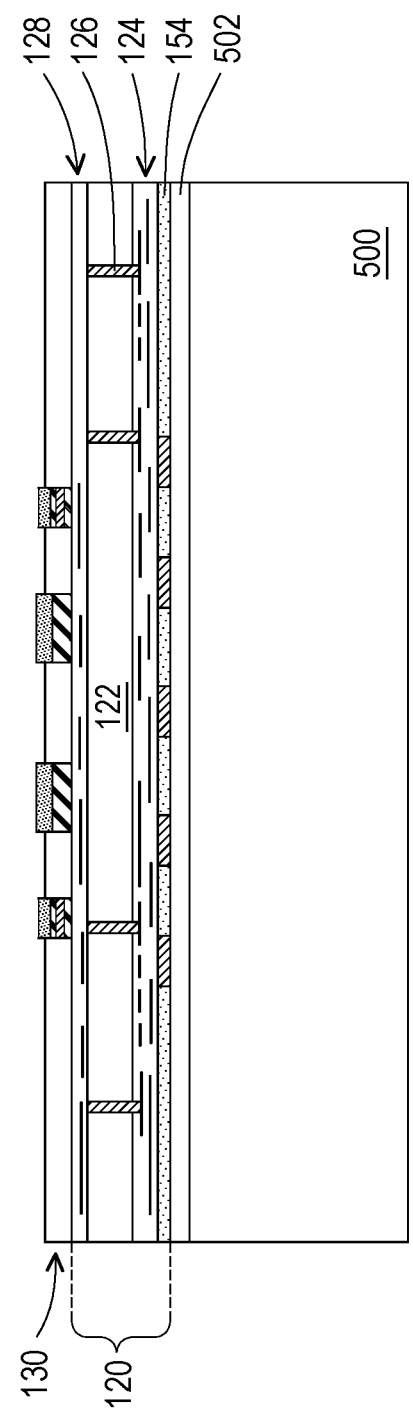

Referring to FIG. 4, FIG. 5A and FIG. 5B, at a step S400, the device die 120 is provided in wafer form and covered with one of the bonding layers 130. As shown in FIG. 5A, processes are performed to form the front metallization layers 124 on the active side of the semiconductor substrate 122, the through substrate vias 126 extending into the semiconductor substrate 122 from the active side of the semiconductor substrate 122, and the contacts 152 as well as the dielectric layer 154 on the outermost front metallization layer 124. As shown in FIG. 5B, the resulted structure is flipped over and attached onto a carrier substrate 500 through an adhesive film 502. Subsequently, the semiconductor substrate 122 is thinned from back side to reveal the through substrate vias 126, and the back metallization layers 128 are formed on the back side of the semiconductor substrate 122. Afterwards, the bonding layer 130 is formed on the back metallization layers 128, and such bonding layer 130 may be formed via the process described with reference to FIG. 3A through FIG. 3E.

Figure 5C:
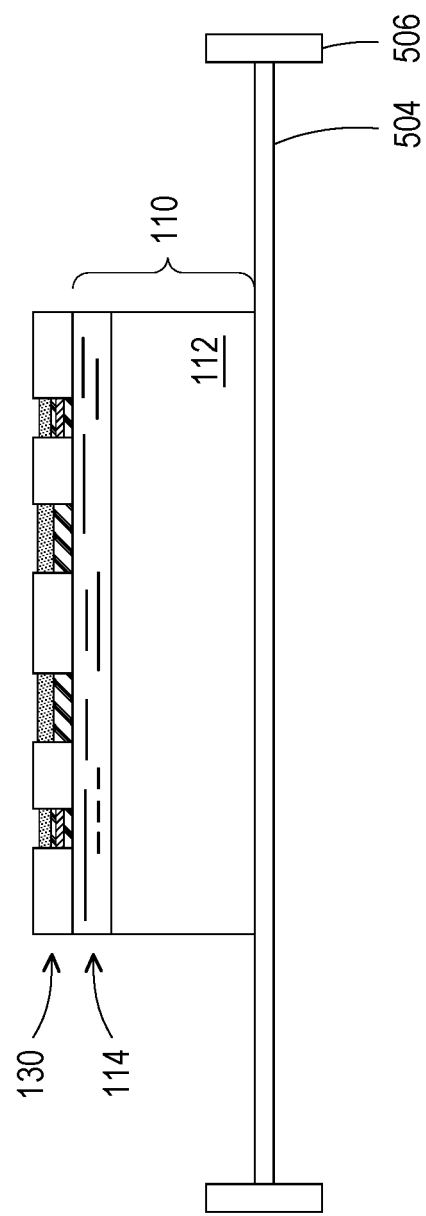

Referring to FIG. 4 and FIG. 5C, at a step S402, the device die 110 is provided in chip form and covered with the other bonding layer 130. Initially, the bonding layer 130 may be formed on the device die 110 in a wafer form, via the process described with reference to FIG. 3A through FIG. 3E. Subsequently, the device die 110 in wafer form and covered with the bonding layer 130 may be attached onto a tap 504 connected to a frame 506, and subjected to singulation. The device die 110 in chip form and covered with the bonding layer 130 is therefore resulted.

Figure 5D:
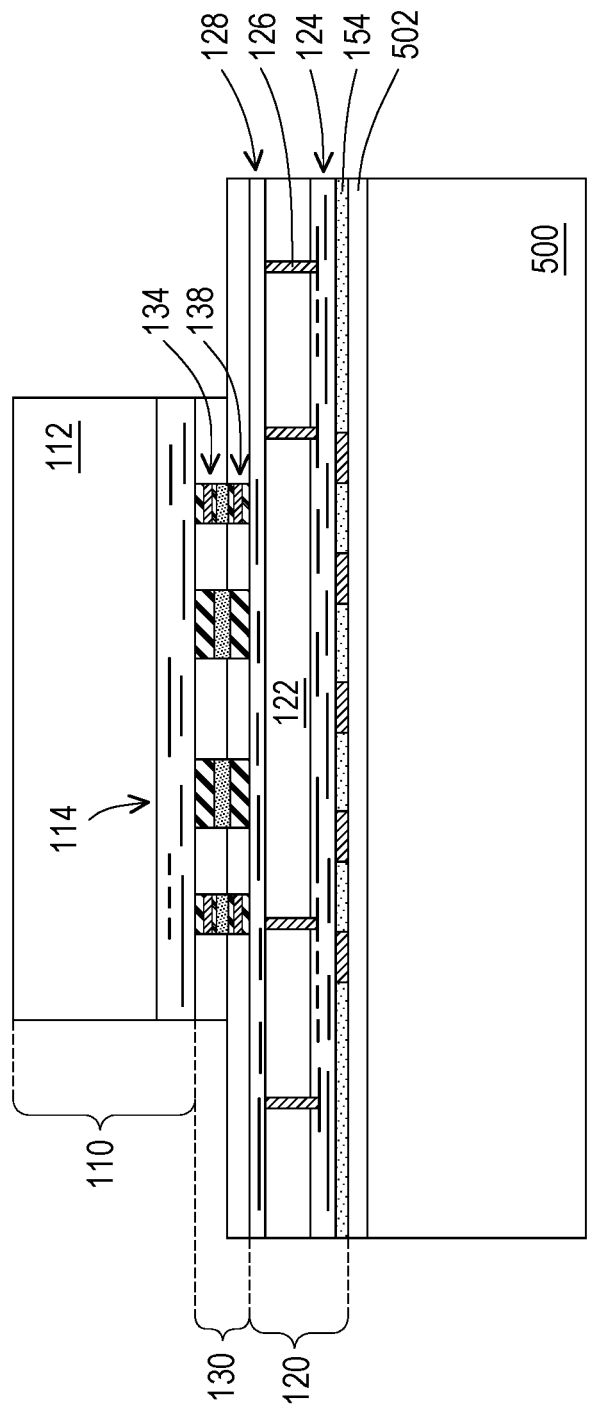

Referring to FIG. 4 and FIG. 5D, at a step S404, the device dies 110, 120 are bonded with each other. Preliminarily, the device die 110 in chip form may be picked and placed on the device die 120 in wafer form, such that the bonding layer 130 covering the device die 110 is in contact with the bonding layer 130 covering the device die 120. After the placement, a thermal treatment described in details with reference to FIG. 3F is performed. As a result, the polymer layers 132, 136 of the bonding layers 130 are bonded with each other, and the contact features 134 in one of the bonding layers 130 are jointed with the contact features 138 in the other bonding layer 130. Consequently, the device dies 110, 120 are bonded with each other via the bonding layers 130.

Figure 5E:
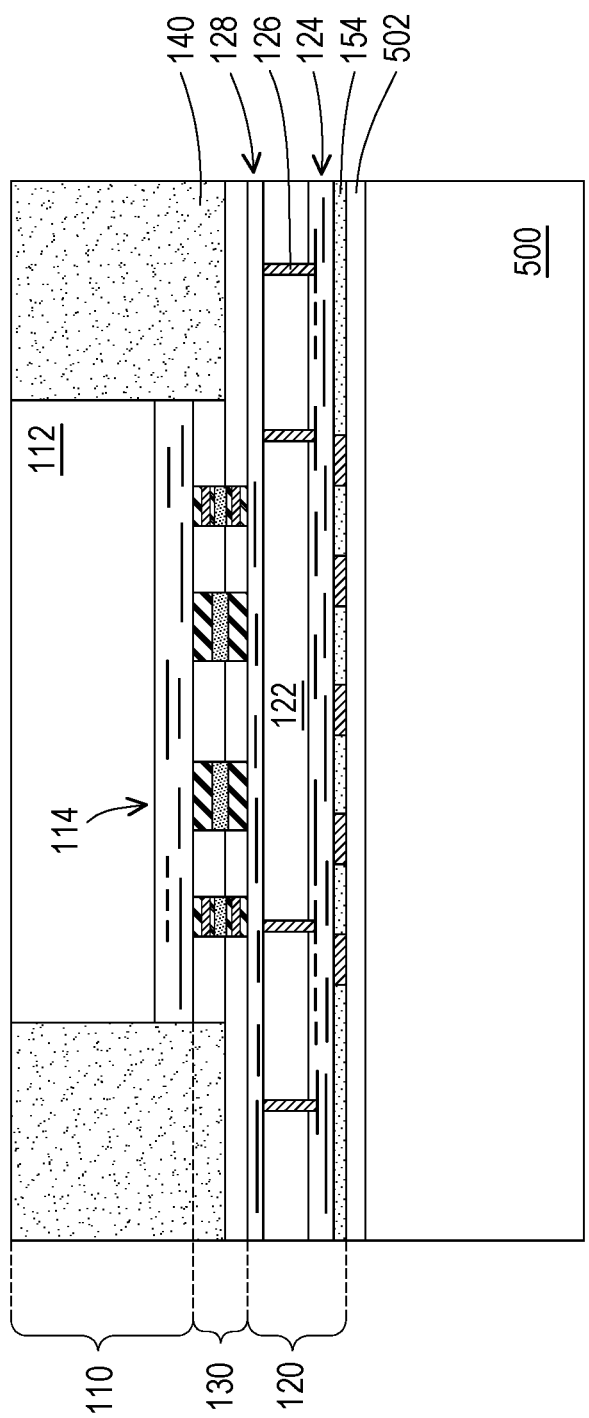

Referring to FIG. 4 and FIG. 5E, at a step S406, the encapsulant 140 is formed on the bonding layer 130 lining along the device die 120 in wafer form. As a result, the encapsulant 140 laterally encapsulates the device die 110 bonded on top of the device die 120, and is in lateral contact with the bonding layer 130 lining along the device die 110.

Figure 5F:
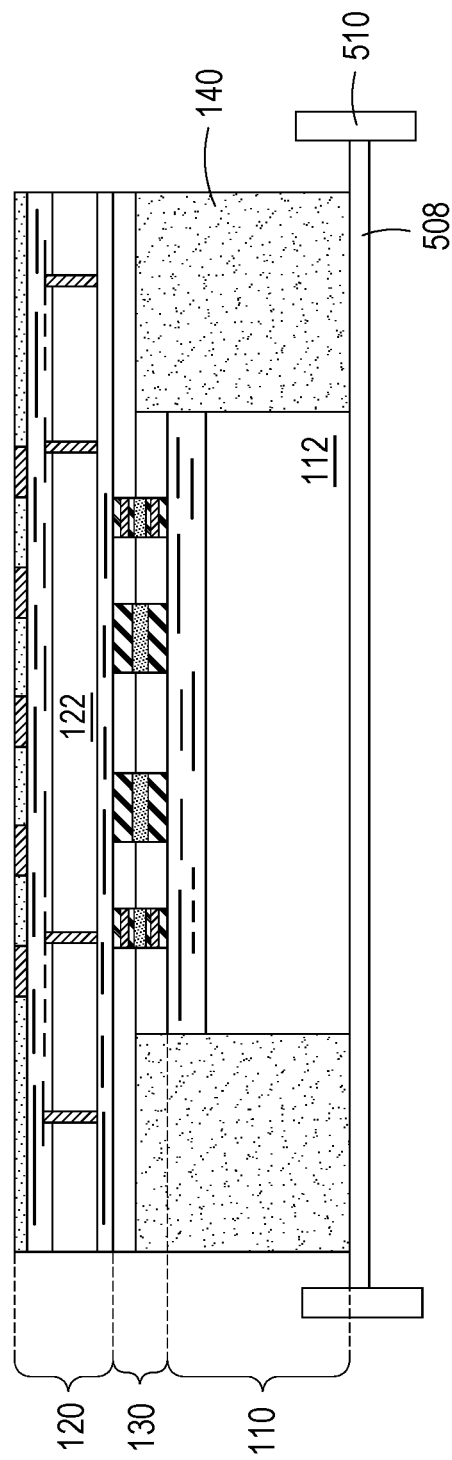

Referring to FIG. 4 and FIG. 5F, at a step S408, the carrier substrate 500 is removed and the current package structure is subjected to singulation. Preliminarily, the package structure shown in FIG. 5E may be flipped over and attached onto a tape 508 connected to a frame 510. Thereafter, the carrier substrate 500 may be detached from the device die 120, along with the adhesive film 502. Further, the current package structure on the tape 508 is singulated. Consequently, and the device die 120 is resulted in chip form, and the bonding layer 130 as well as the encapsulant 140 is cut along with the device die 120.

Figure 5G:
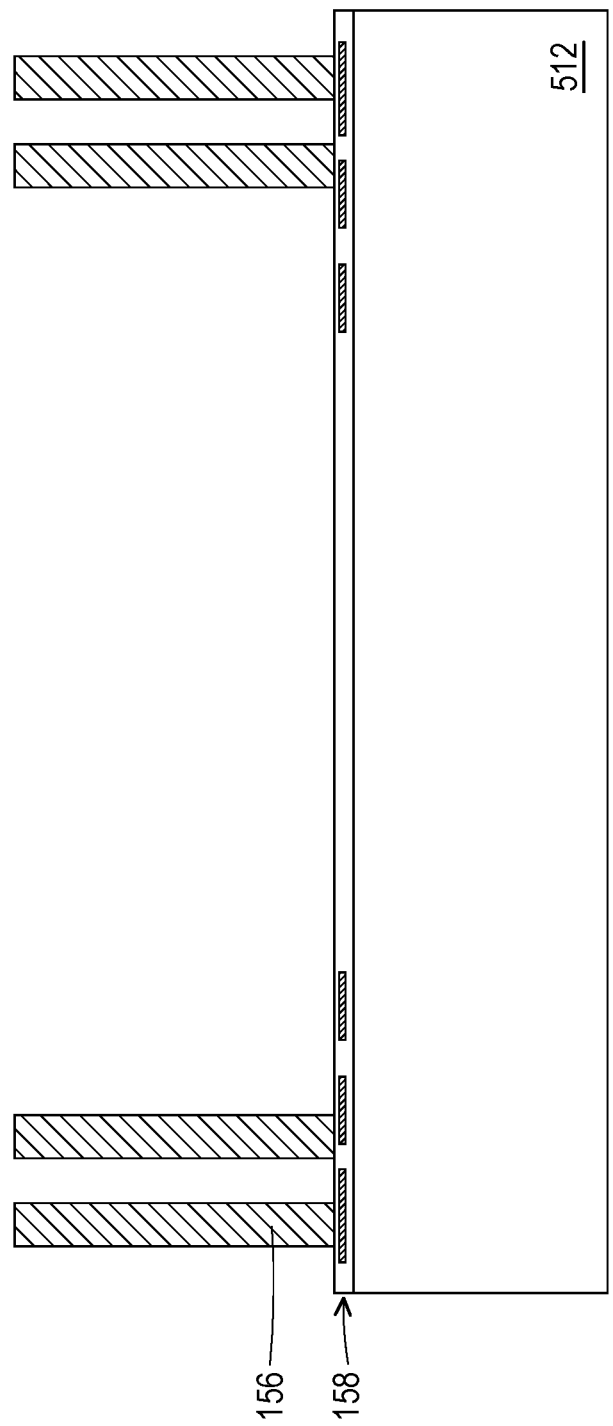

Referring to FIG. 4 and FIG. 5G, at a step S410, the redistribution structure 158 are formed on another carrier substrate 512, and the through encapsulant vias 156 are formed on the redistribution structure 158. Some of the through encapsulant vias 156 are sufficiently spaced apart, such that a wide spacing defined between these through encapsulant vias 156 can accommodate the package structure resulted on the tape 508 shown in FIG. 5F.

Figure 5H:
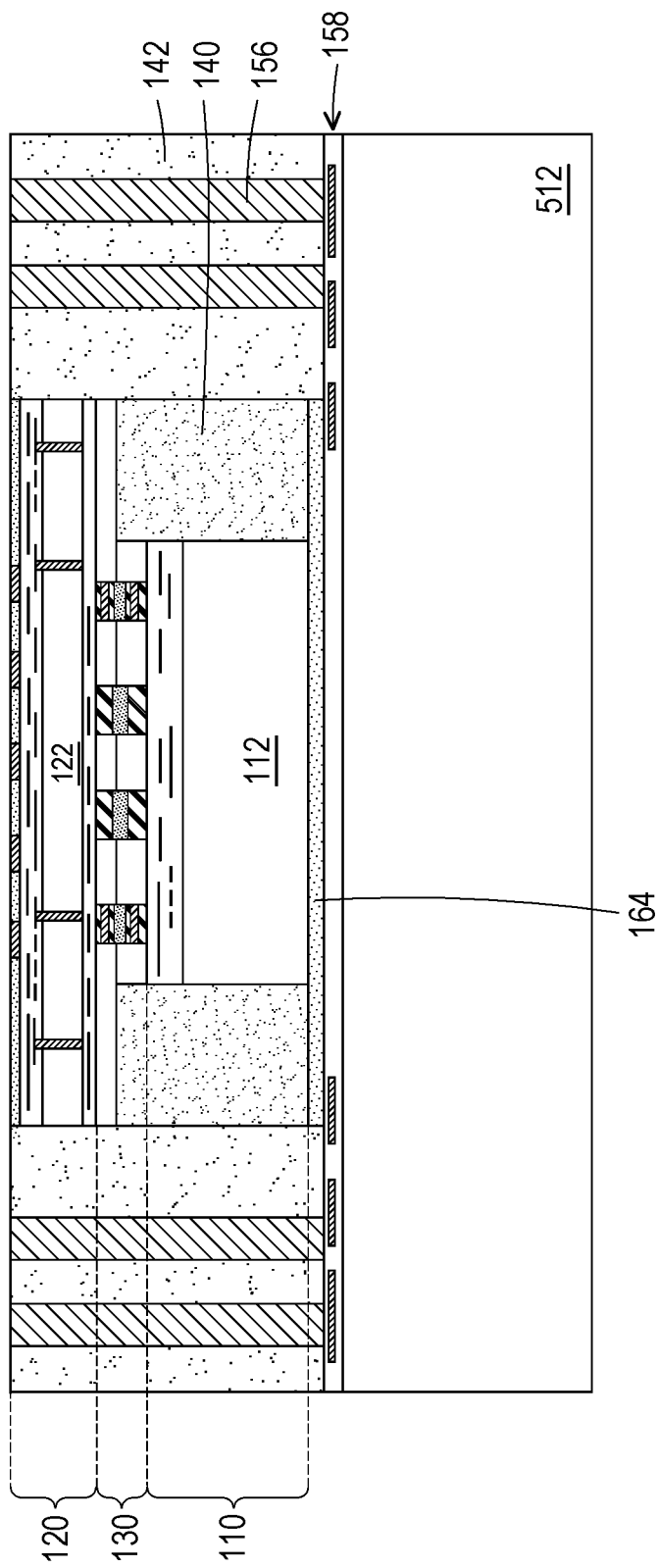

Referring to FIG. 4 and FIG. 5H, at a step S412, the package structure resulted on the tape 508 shown in FIG. 5F is picked and placed onto the redistribution structure 158 in between the through encapsulant vias 156. Specifically, the package structure is oriented that the device die 110 and the encapsulant 140 face toward the redistribution structure 158. The adhesive film 164 may lie between the package structure and the redistribution structure 158, to enhance adhesion between the redistribution structure 158 and each of the device die 110 and the encapsulant 140. Thereafter, at a step S414, the encapsulant is formed on the redistribution structure 158, to laterally encapsulated the through encapsulant vias 156 and the package structure on the redistribution structure 158.

Figure 5J:
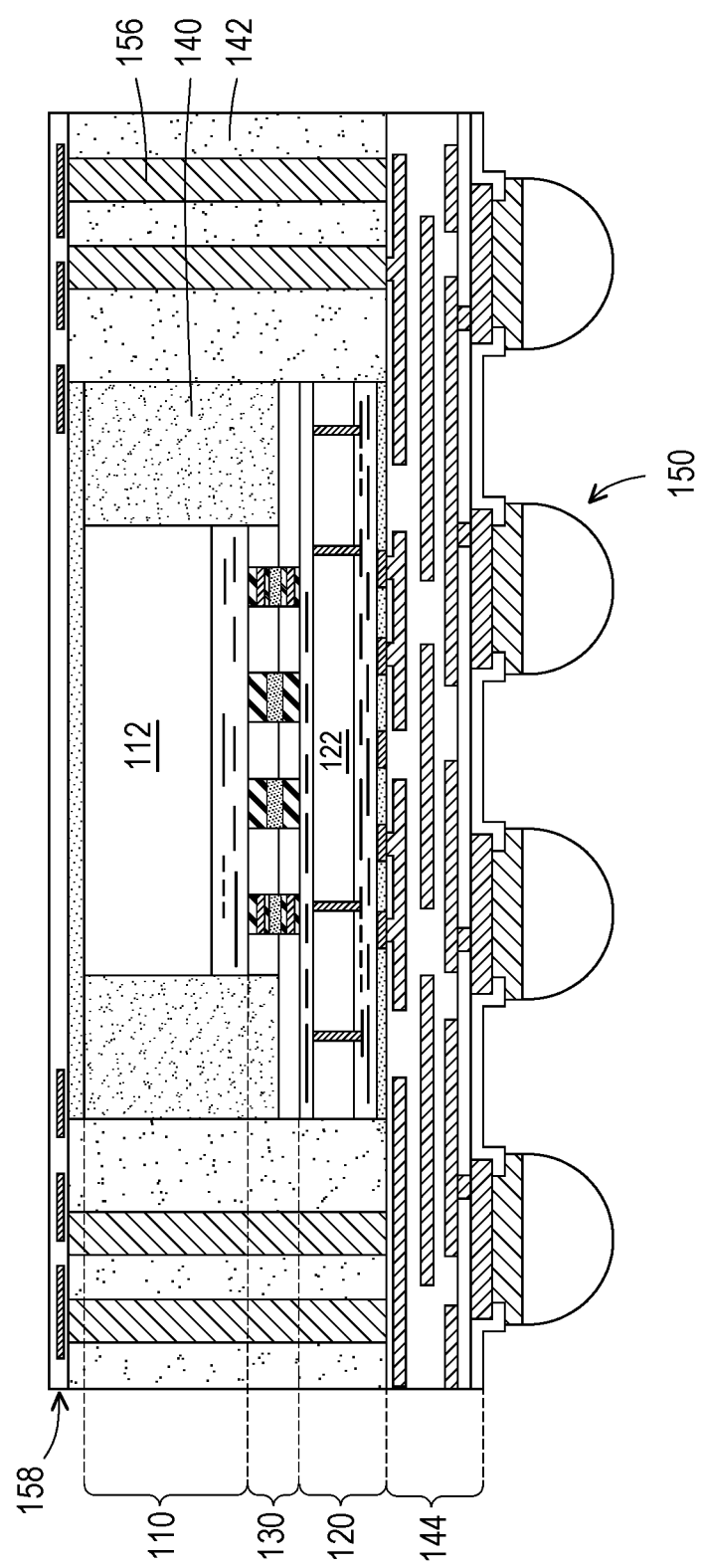

Referring to FIG. 4 and FIG. 5I, at a step S416, the redistribution structure 144 and the conductive bumps 150 are formed on the encapsulant 142. Subsequently, at a step S418 as shown in FIG. 5J, the carrier substrate 512 is detached from the current package structure. Preliminarily, the package structure shown in FIG. 5I may be flipped over and attached to a tape (not shown). Thereafter, the carrier substrate 512 is detached from the redistribution structure 158.

At a following step S420, a singulation is performed on the current package structure. Further, at a step S422, the package component 166 may be attached onto the singulated package structure via the conductive bumps 168, and the resulted semiconductor package 100 is shown in FIG. 1A.

As described, the device die 110 is bonded to the device die 120 via a face-to-back manner. However, in other embodiments, the device 110 is bonded to the device die 120 via a face-to-face manner.

Figure 6:
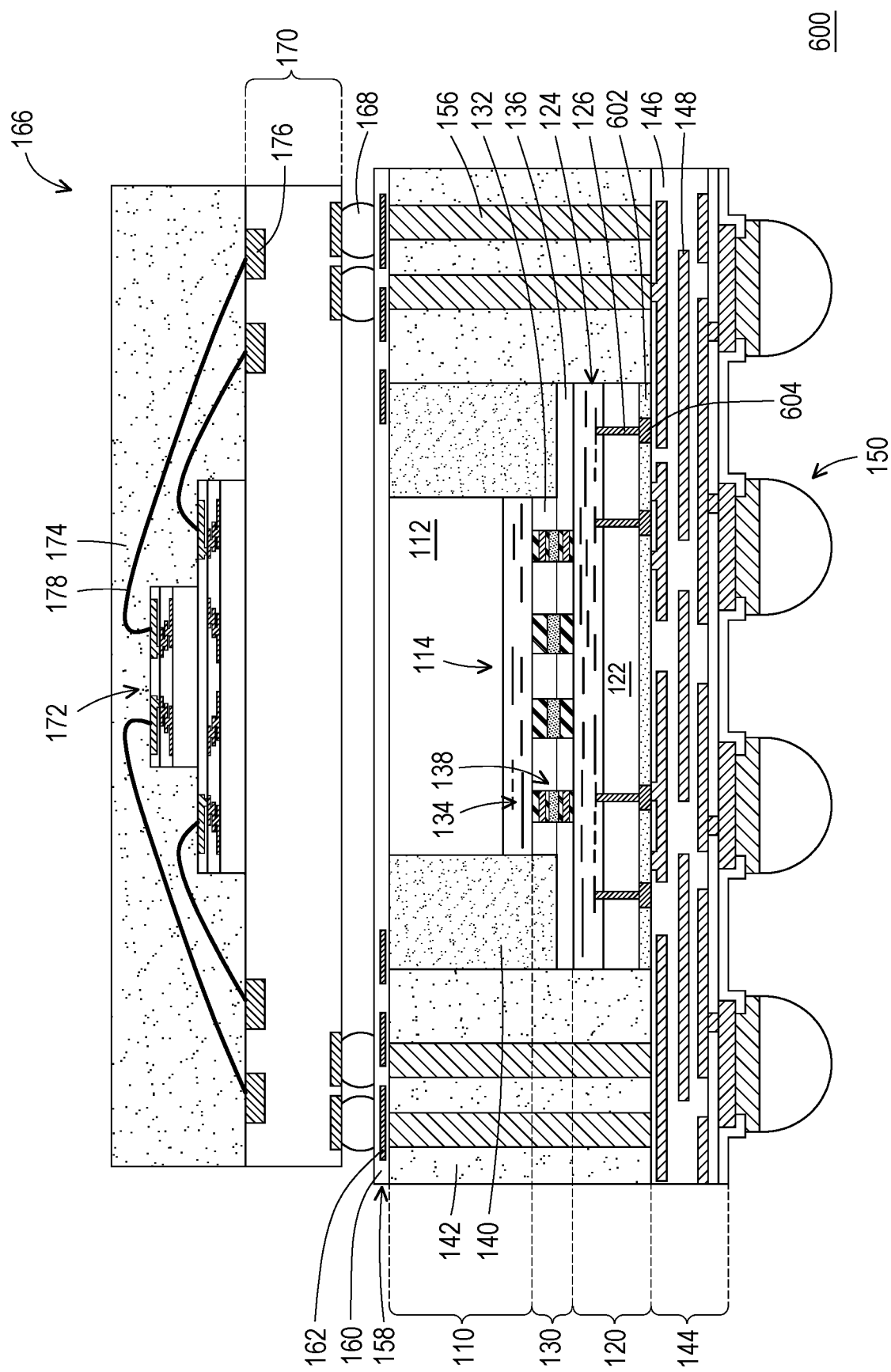
FIG. 6 is a schematic cross-sectional view illustrating a semiconductor package, according to some embodiments of the present disclosure.

FIG. 6 is a schematic cross-sectional view illustrating a semiconductor package 600, according to some embodiments of the present disclosure.

The semiconductor package 600 is similar to the semiconductor package 100 as described with reference to FIG. 1A and FIG. 1B, except that the device dies 110, 120 in the semiconductor package 600 are bonded with each other via a face-to-face manner. As shown in FIG. 6, one of the bonding layers 130 extends along the active side of the device die 110 (the side of the metallization layers 114 facing away from the semiconductor substrate 112), and the other bonding layer 130 extends along the active side of the device die 120 (the side of the front metallization layers 124 facing away from the semiconductor substrate 122). In this way, the bottom redistribution structure 144 is in contact with the back side of the device die 120. According to some embodiments, an insulating layer 602 is formed along the back side of the device die 120, and conductive features 604 in the insulating layer 602 are functioned as contacts of the through substrate vias 126 extending through the semiconductor substrate 122 of the device die 120.

Figure 7:
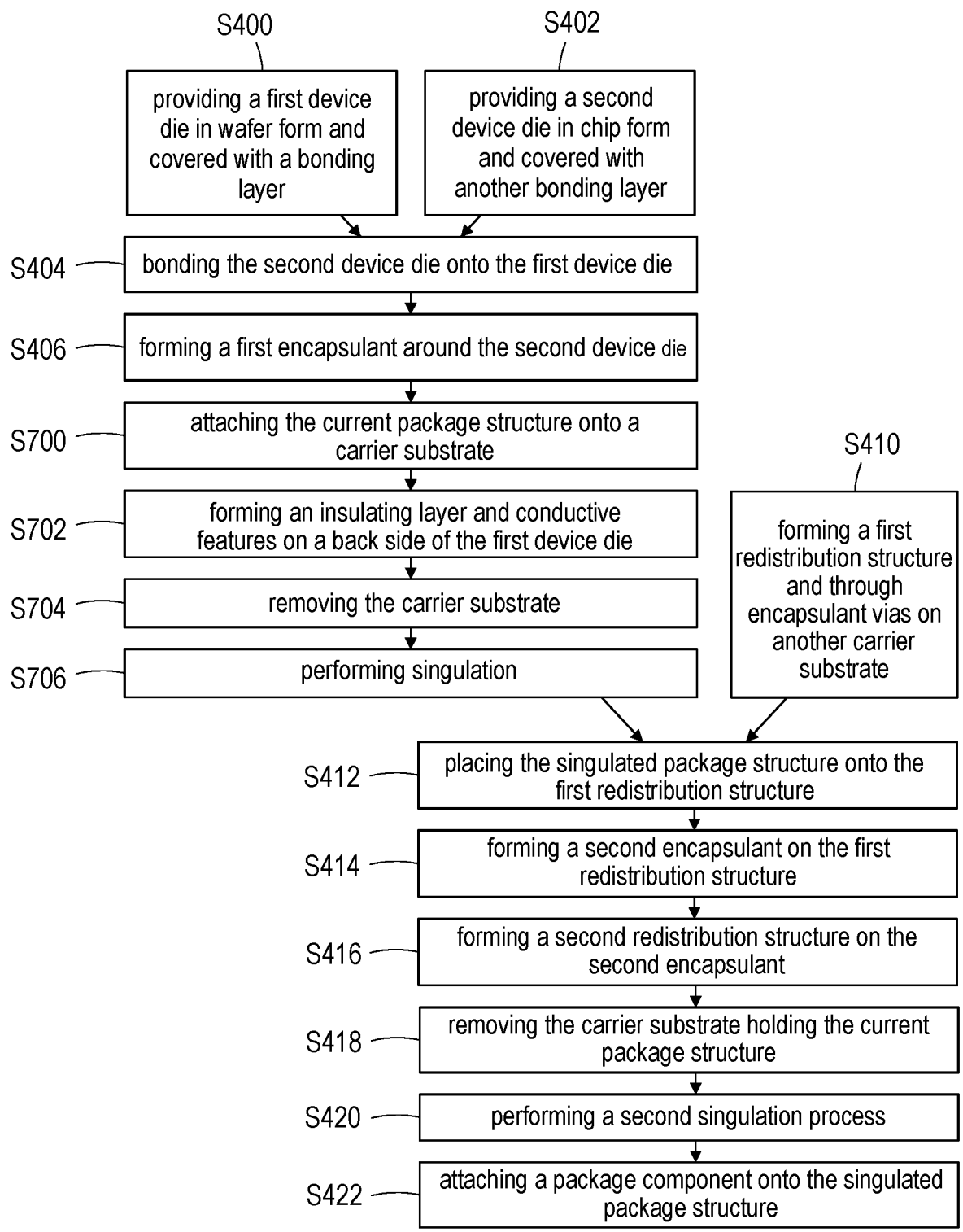
FIG. 7 is a flow diagram illustrating a process for forming the semiconductor package shown in FIG. 6, according to some embodiments of the present disclosure.
Figure 8A:
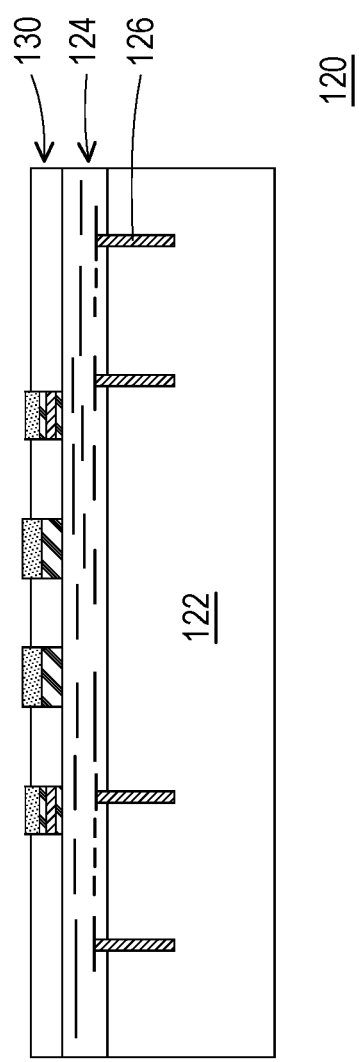
FIG. 8A through FIG. 8C are schematic cross-sectional views illustrating intermediate structures at various stages during the process shown in FIG. 7.
Figure 8B:
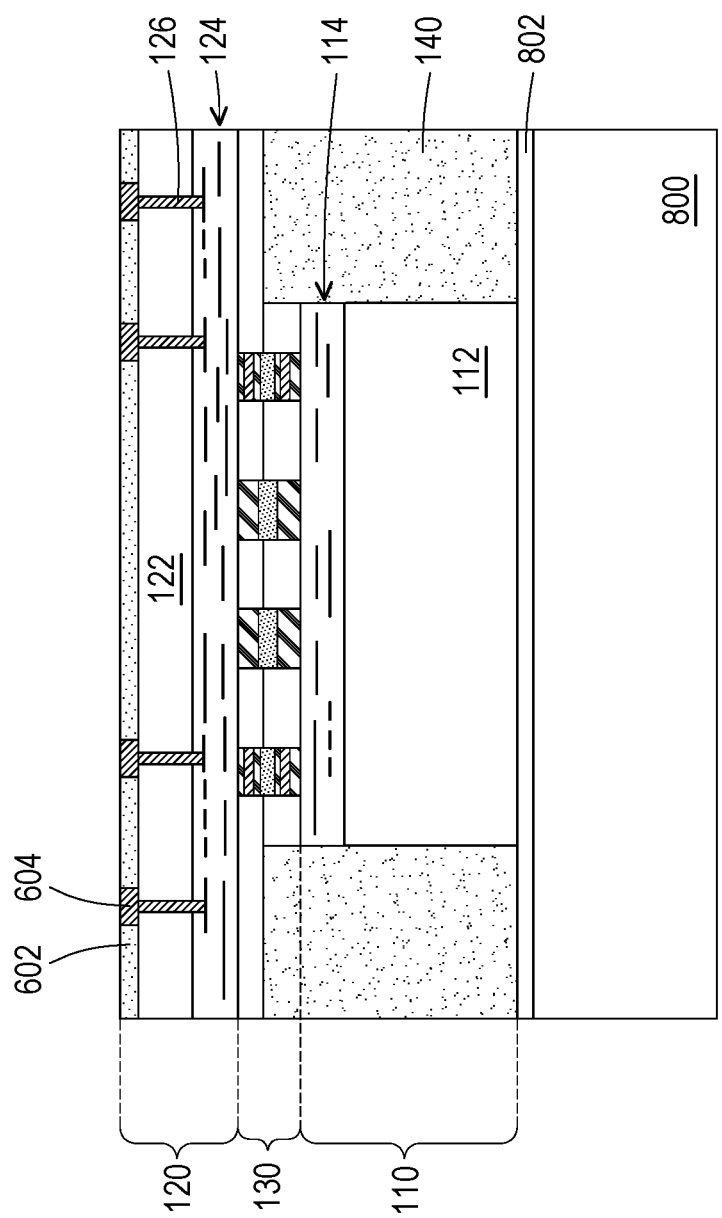
Figure 8C:
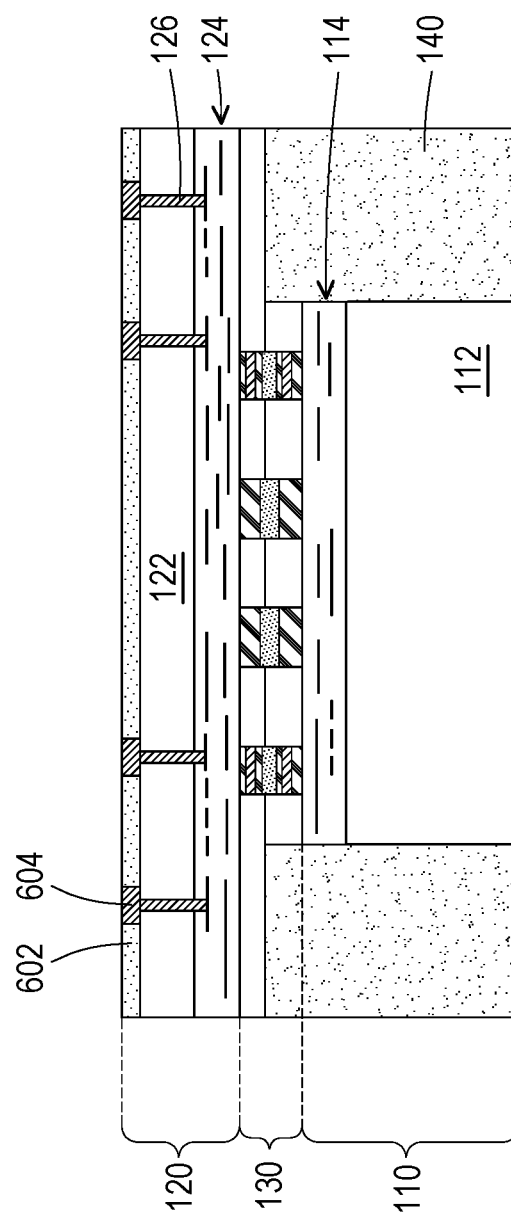

FIG. 7 is a flow diagram illustrating a process for forming the semiconductor package 600, according to some embodiments of the present disclosure. FIG. 8A through FIG. 8C are schematic cross-sectional views illustrating intermediate structures at various stages during the process shown in FIG. 7.

The process for forming the semiconductor package 600 is similar to the process described with reference to FIG. 4 and FIG. 5A through FIG. 5J, except for a few differences to be described in further details.

As shown in FIG. 8A, at the step S400 of providing the device die 120 in wafer form and covered with one of the bonding layers 130, the bonding layer 130 is formed on the front metallization layers 124 of the device die 120. Further, formation of the back metallization layers 128 may be absent, and a carrier substrate for holding the device die 120 may not be required.

After performing the step S404 of die bonding and the step S406 of encapsulation, the resulted package structure in wafer form is attached onto a carrier substrate 800 at a step S700 as shown in FIG. 8B. Specifically, the package structure may be attached to the carrier substrate 800 by the semiconductor substrate 112 of the device die 110 and the encapsulant 140. In addition, an adhesive film 802 may lie in between, to enhance adhesion between the carrier substrate 800 and each of the semiconductor substrate 112 and the encapsulant 140. After the attachment, the back surface of the semiconductor substrate 122 of the device die 120 may be exposed, and the semiconductor substrate 122 may be thinned to reveal the through substrate vias 126. At a step S702, the insulating layer 602 and the conductive features 604 are furthered formed on the back surface of the semiconductor substrate 122, such that the conductive features 604 can be functioned as contacts of the through substrate vias 126.

Referring to FIG. 7 and FIG. 8C, at a step S704, the carrier substrate 800 may be detached from the current package structure. In the example that the adhesive film 802 is included, the adhesive film 802 may be removed along with the carrier substrate 800. At a following step S706, the current package structure is subjected to singulation. Consequently, and the device die 120 is resulted in chip form, and the bonding layer 130 as well as the insulating layer 602 lining along the device die 120 and the encapsulant 140 around the device die 110 are cut along with the device die 120. Although not shown, the package structure may be attached onto a tape by the insulating layer 602 during singulation.

Further, as the redistribution structure 158 and the through encapsulant vias 156 have been provided on another carrier substrate 512 at the step S410, the singulated package structure prepared by the step S706 is subjected to a series of the steps S412, S414, S416, S418, S420 to complete formation of the semiconductor package 600 as shown in FIG. 6.

In addition to orientations of the device dies 110, 120, a way of securing the electrical connectors 180a, 180b may be varied. In the embodiments described above, the electrical connectors 180a, 180b are secured by the polymer layers 132, 136 lining along bonding sides of the device dies 110, 120. In other embodiments, the electrical connectors 180a, 180b may be secured by an underfill.

Figure 9A:
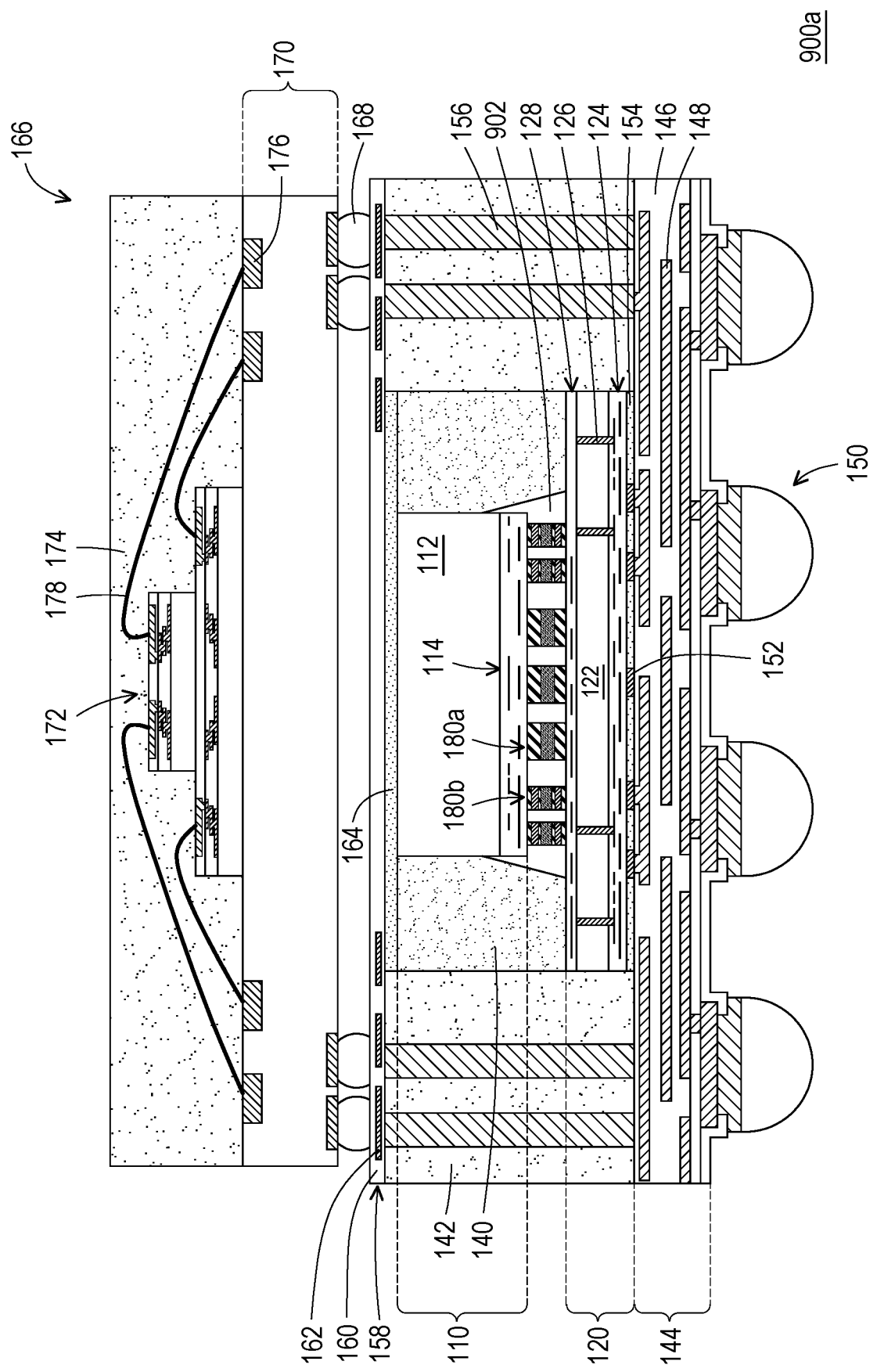
FIG. 9A and FIG. 9B are schematic cross-sectional views illustrating semiconductor packages, according to some embodiments of the present disclosure.
Figure 9B:
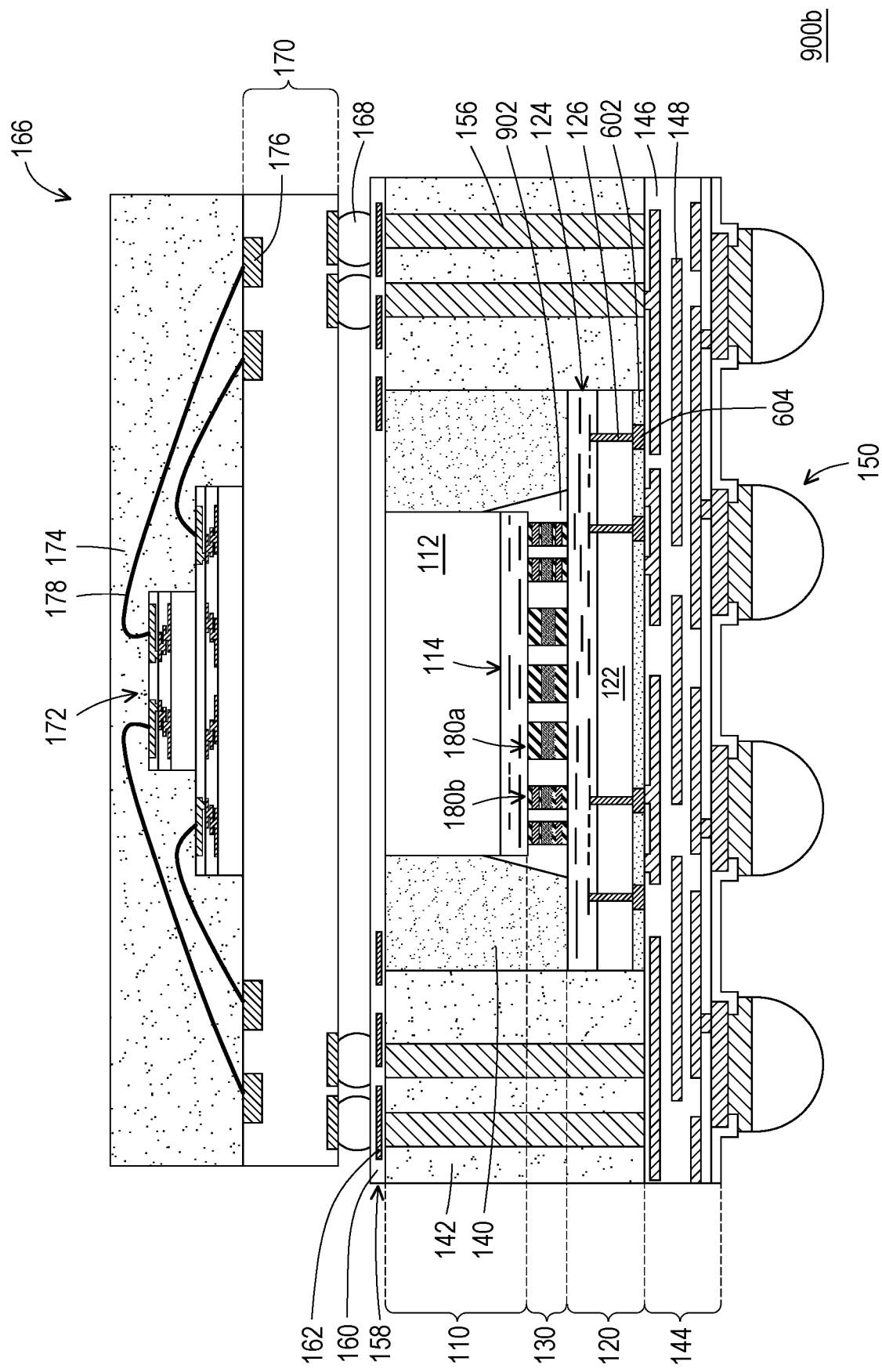

FIG. 9A and FIG. 9B are schematic cross-sectional views illustrating semiconductor packages 900a, 900b, according to some embodiments of the present disclosure.

The semiconductor package 900a shown in FIG. 9A is structurally similar to the semiconductor package 100 described with reference to FIG. 1A and FIG. 1B, except that the electrical connectors 180a, 180b in the semiconductor package 900a are enclosed in an underfill 902. Also, a manufacturing process for forming the semiconductor package 900 is similar to the described manufacturing process for forming the semiconductor package 100, except for formation of bonding mechanism between the device dies 110, 120. As similar to the process described with reference to FIG. 2 and FIG. 3A through FIG. 3F, formation of bonding mechanism between the device dies 110, 120 in the semiconductor package 900 may include forming the contact features 134 on the device dies 110 by using separate series of plating processes, and include forming the contact features 138 on the device dies 120 by using separate series of plating processes as well. Subsequently, the contact features 134 are jointed with the contact features 138 by using soldering flux, to form the electrical connectors 180a, 180b. Afterwards, the underfill 902 may be provided around the electrical connectors 180a, 180b, and the device dies 110, 120 are bonded with each other.

On the other hand, the semiconductor package 900b shown in FIG. 9B is structurally similar to the semiconductor package 600 described with reference to FIG. 6, except that the electrical connectors 180a, 180b in the semiconductor package 900b are enclosed in the underfill 902. The process described with reference to FIG. 7 may be used for forming the semiconductor package 900b, except that formation of bonding mechanism between the device dies 110, 120 may be modified, as described with reference to FIG. 9A.

More variations can be applied without departing from spirit and scope of the present disclosure. As described, the electrical connectors 180a, 180b may respectively have a symmetry layer design. Alternatively, the electrical connectors 180b may each have an asymmetry layer design, while the electrical connectors 180a may maintain the symmetry layer design.

Figure 10:
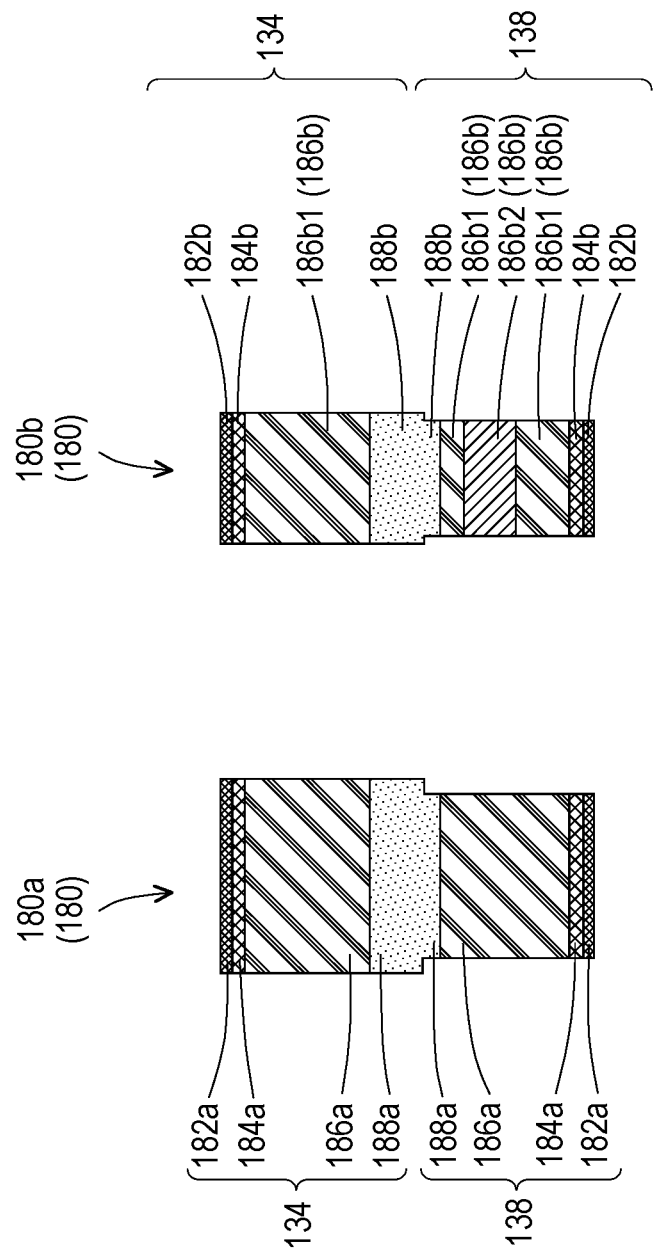
FIG. 10 is a schematic cross-sectional view illustrating electrical connectors, according to some alternative embodiments of the present disclosure.

FIG. 10 is a schematic cross-sectional view illustrating the electrical connectors 180a, 180b, according to some alternative embodiments of the present disclosure.

Referring to FIG. 10, in some alternative embodiments, each of the electrical connectors 180b has an asymmetry layer design. Specifically, in these alternative embodiments, layer design of each contact feature 134 provided as an upper half of one of the electrical connectors 180b is different from layer design of each contact feature 138 provided as a lower half of one of the electrical connectors 180b. For instance, each contact feature 134 as an upper half of one of the electrical connectors 180b may include one thick first metallic layer 186b1 lying between the seed layers 182b, 184b and the solder joint 188b, whereas each contact feature 138 as a lower half of one of the electrical connectors 180*b* may include two first metallic layers 186*b*1 with an inserted second metallic layer 186*b*2 between the seed layers 182*b*, 184*b* and the solder joint 188*b*. Although not shown, as another example, each contact feature 134 as an upper half of one of the electrical connectors 180*b* may include two first metallic layers 186*b*1 with an inserted second metallic layer 186*b*2 between the seed layers 182*b*, 184*b* and the solder joint 188*b*, whereas each contact feature 138 as a lower half of one of the electrical connectors 180*b* may include one thick first metallic layer 186*b*1 lying between the seed layers 182*b*, 184*b* and the solder joint 188*b*.

On the other hand, the electrical connectors 180*a* may have symmetry layer design, as described with reference to FIG. 1B. The electrical connectors 180*a*, 180*b* described with reference to FIG. 10 can be alternatively used in any of the semiconductor packages illustrated in the present disclosure.

Furthermore, the electrical connectors 180*a*, 180*b* in each of the semiconductor packages described in the present disclosure can be deployed in various arrangements. A few arrangements of the electrical connectors 180*a*, 180*b* will be described, but the present disclosure is not limited to these exemplary arrangements of the electrical connectors 180*a*, 180*b*.

Figure 11A:
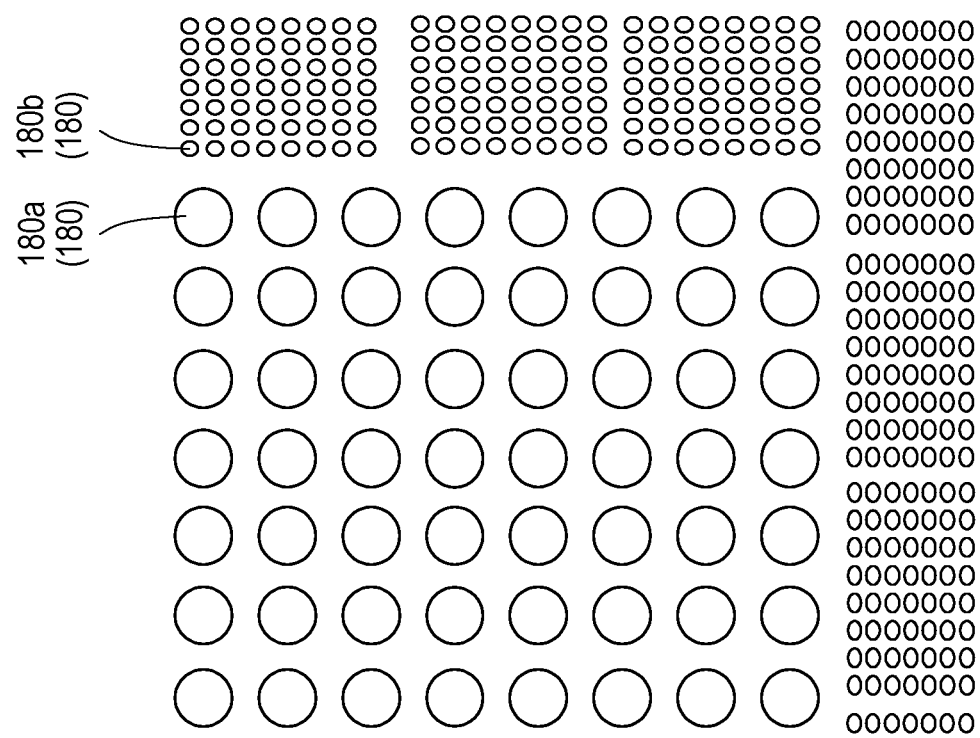
FIG. 11A and FIG. 11B are respectively a schematic plan view illustrating arrangement of the electrical connectors, according to some embodiments of the present disclosure.
Figure 11B:
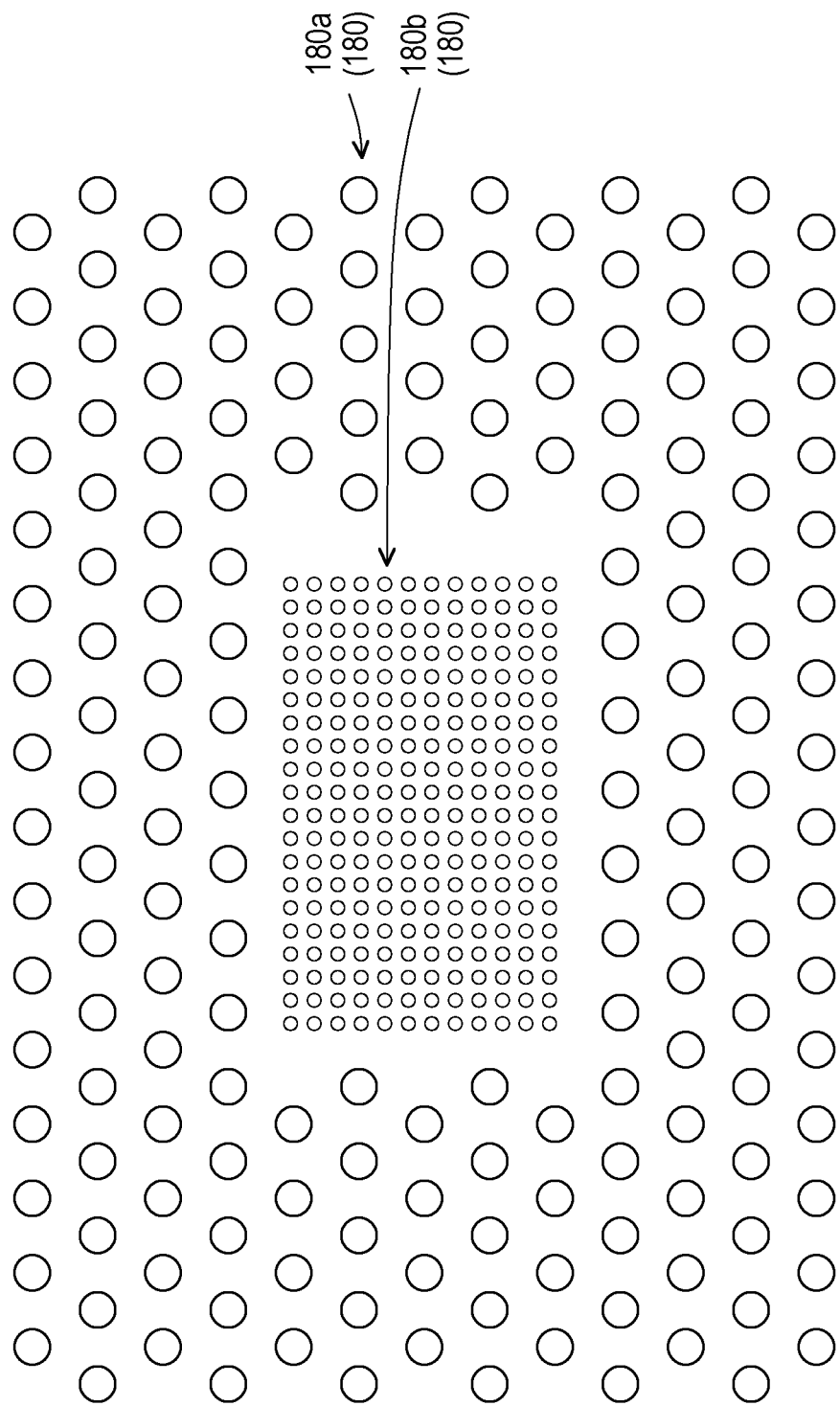

FIG. 11A and FIG. 11B are respectively a schematic plan view illustrating arrangement of the electrical connectors 180*a*, 180*b*, according to some embodiments of the present disclosure.

The electrical connectors 180*a* and the electrical connectors 180*b* are distributed in adjacent areas. As shown in FIG. 11A, according to some embodiments, the electrical connectors 180*a* with greater pitch and greater critical width are surrounded by the electrical connectors 180*b* with shorter pitch and shorter critical width. For instance, arrays of the electrical connectors 180*b* are arranged along two sides of an array of the electrical connectors 180*a*. As shown in FIG. 11B, according to other embodiments, the electrical connectors 180*b* with shorter pitch and shorter critical width are arranged as islands (only a single one is shown) surrounded by the electrical connectors 180*a* with greater pitch and greater critical width.

Figure 11C:
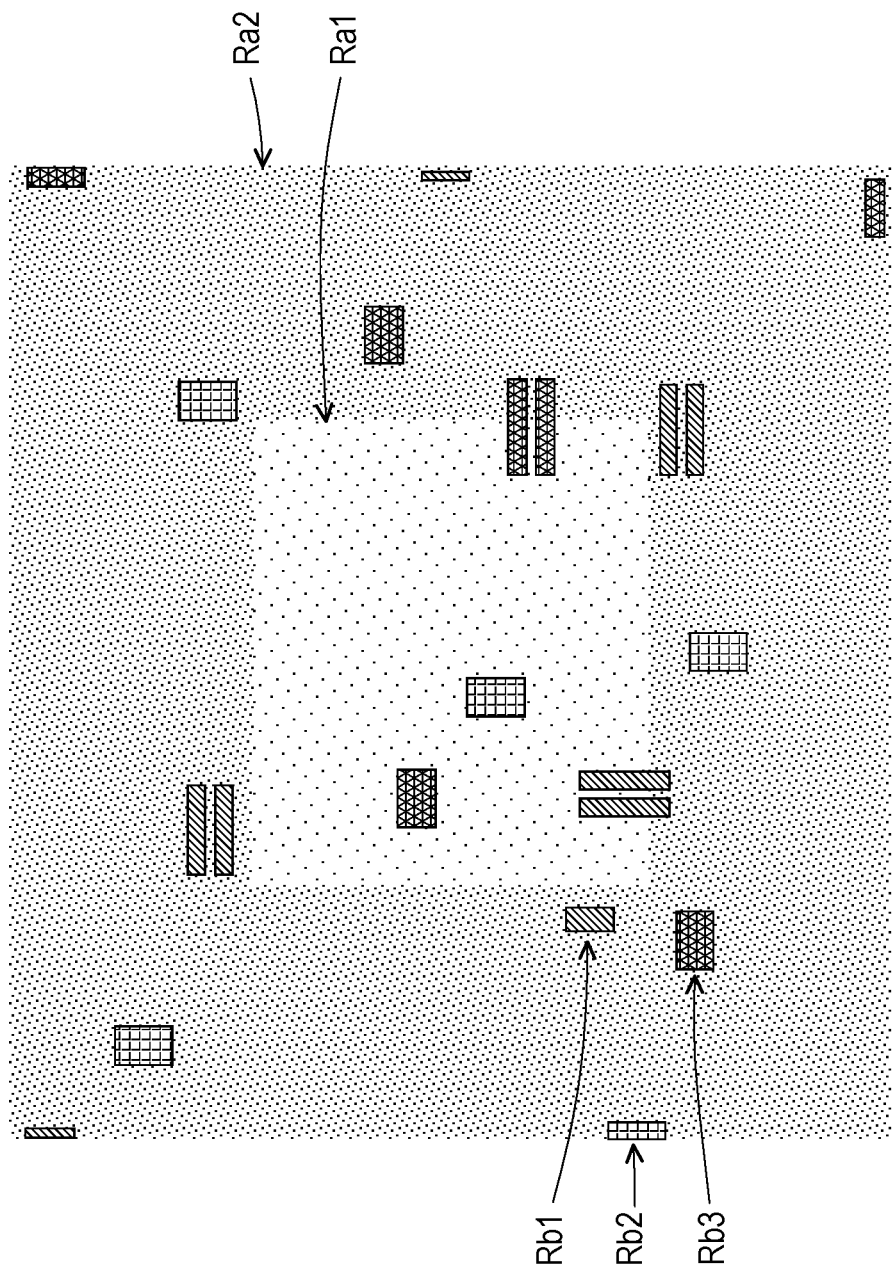
FIG. 11C is a schematic plan view illustrating an arrangement of the electrical connectors, according to further embodiments of the present disclosure.

FIG. 11C is a schematic plan view illustrating an arrangement of the electrical connectors 180*a*, 180*b*, according to further embodiments of the present disclosure.

Referring to FIG. 11C, according to further embodiments, the electrical connectors 180*a* are arranged in regions Ra1 and Ra2, and the electrical connectors 180*b* are arranged in regions Rb1, Rb2, Rb3 separately distributed within the regions Ra1, Ra2. The electrical connectors 180*a* in the region Ra1 and the electrical connectors 180*a* in the region Ra2 are different in terms of pitch and critical width. Similarly, the electrical connectors 180*b* in the regions Rb1, Rb2, Rb3 are different in terms of pitch and critical width. Nevertheless, even the shortest pitch and critical width of the electrical connectors 180*a* are longer than the greatest pitch and critical width of the electrical connectors 180*b*, respectively. In the example shown in FIG. 11C, the region Ra1 is enclosed by the region Ra2, and the regions Rb1. Rb2, Rb3 are separately distributed within the regions Ra1, Ra2. Some of the regions Rb1, Rb2, Rb3 even extend across an interface between the regions Ra1, Ra2.

From here, more alternatives of semiconductor packages available for applying the electrical connectors 180*a*, 180*b* will be described.

FIG. 12 through FIG. 16 are schematic cross-sectional views respectively illustrating a semiconductor package, according to some embodiments of the present disclosure.

Figure 12:
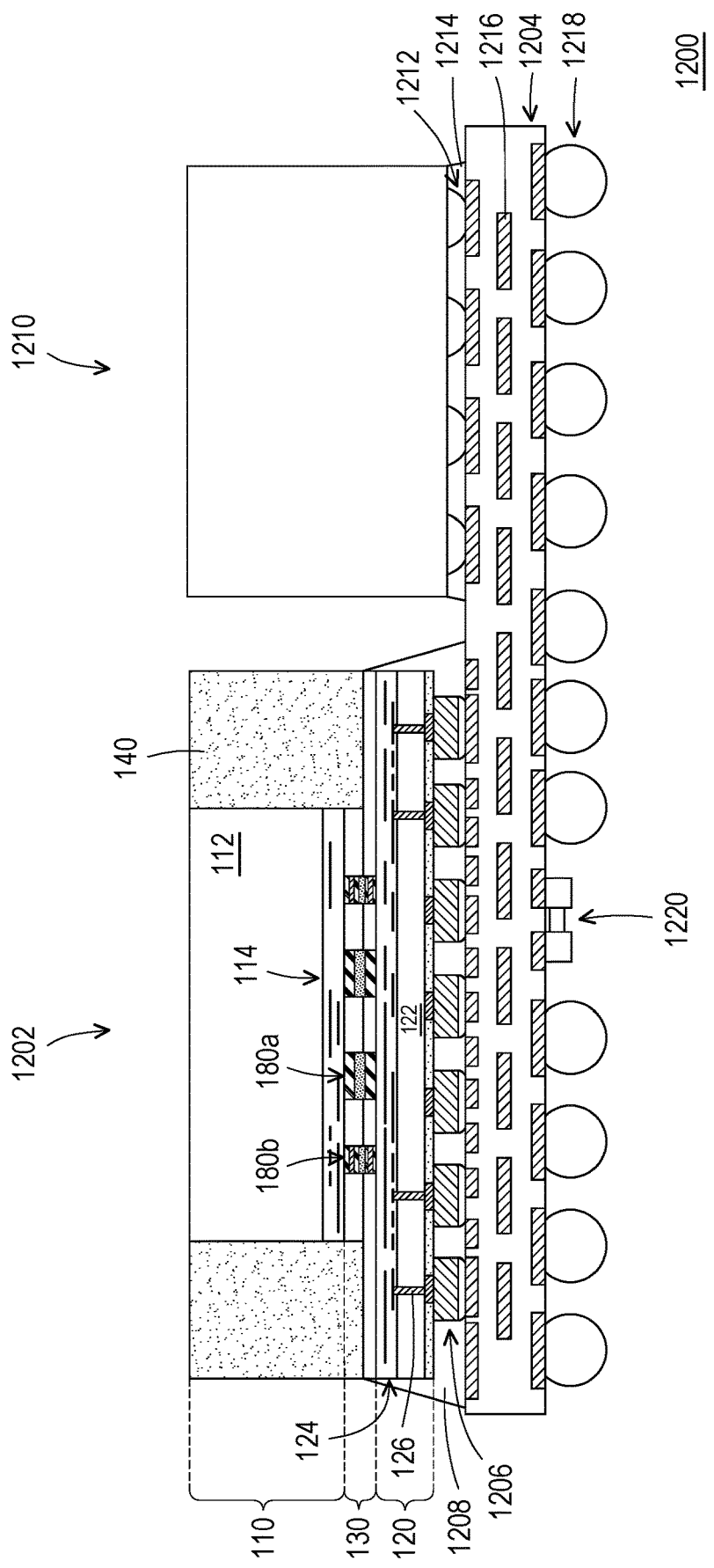
FIG. 12 through FIG. 16 are schematic cross-sectional views respectively illustrating a semiconductor package, according to some embodiments of the present disclosure.

Referring to FIG. 12, the electrical connectors 180*a*, 180*b* are applied in a multi-chip module (MCM) semiconductor package 1200. The semiconductor package 1200 includes a package component 1202 as a sub-package structure shown in FIG. 6, which includes the device dies, 110, 120 oriented as face-to-face, the bonding layers 130 in between the device dies 110, 120 and the encapsulant 140 laterally surrounding the device die 110 and one of the bonding layers 130 lining along the device die 110. The package component 1202 is further attached to a package substrate 1204 via conductive bumps 1206. In some embodiments, the conductive bumps 1206 are sealed in an underfill 1208 filled in between the package component 1202 and the package substrate 1204.

In addition, another package component 1210 is also attached onto the package substrate 1204, and the package components 1202, 1210 are arranged side-by-side on the package substrate 1204. As an example, the package component 1210 may include a stack of device dies (not shown). Conductive bumps 1212 may be used for connecting the package component 1210 to the package substrate 1204, and an underfill 1214 may be filled in between the package component 1210 and the package substrate 1204, to secure the conductive bumps 1212.

Routing elements 1216 in the package substrate 1204 may establish conduction paths for interconnecting the package components 1202, 1210, and for routing each of the package components 1202, 1210 to the other side of the package substrate 1204. As input/output (I/O) terminals of the semiconductor package 1200, conductive bumps 1218 may be disposed at the side of the package substrate 1204 facing away from the package components 1202, 1210. In some embodiments, a passive devices 1220 may be mounted to the side of the package substrate 1204 facing away from the package components 1202, 1210, in between adjacent ones of the conductive bumps 1220.

Several variations can be applied to the semiconductor package 1200. For instance, the package component 1202 may be replaced by a package component as a sub-package structure shown in FIG. 1A, which includes the device dies 110, 120 oriented as face-to-back, the bonding layers 130 in between the device dies 110, 120 and the encapsulant 140 laterally surrounding the device die 110 and one of the bonding layers 130 lining along the device die 110. In addition, the electrical connectors 180*a*, 180*b* arranged in between the device dies 110, 120 may otherwise be secured by an underfill, as similar to the electrical connectors 180*a*, 180*b* shown in FIG. 9A or FIG. 9B. Further, the electrical connectors 180*a*, 180*b* may be both formed with the symmetry layer design as described with reference to FIG. 1B. Alternatively, as described with reference to FIG. 10, the electrical connectors 180*a* may be formed with the asymmetry layer design, while the electrical connectors 180*b* may be formed with the symmetry layer design. Moreover, the electrical connectors 180*a*, 180*b* can be deployed according to various arrangements, such as those described with reference to FIG. 11A through FIG. 11C.

Figure 13:
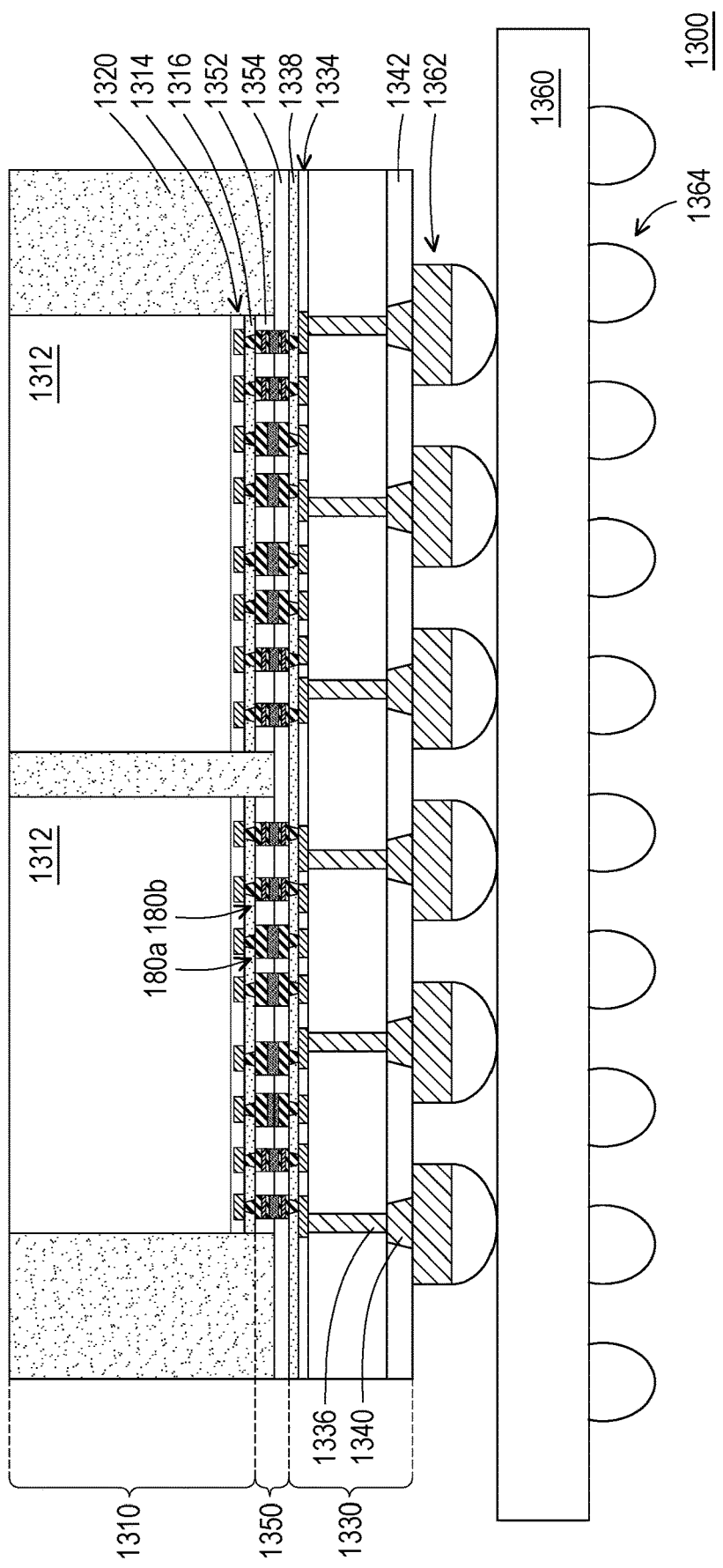

Referring to FIG. 13, the electrical connectors 180*a*, 180*b* can be used in a semiconductor package 1300. The semiconductor package 1200 is a 2.5D semiconductor package, in which a plurality of device dies 1310 are laterally encapsulated by an encapsulant 1320, and attached onto an interposer 1330. Conductive features formed in the interposer 1330 are configured to bridge the device dies 1310, and to rout the device dies 1310 to the other side of the interposer 1330. As similar to the device die 110 described with reference to FIG. 1A, each of the device dies 1310 may include a semiconductor substrate 1312 and metallization layers 1314 (only a single one is shown) stacked on an active side of the semiconductor substrate 1312. In some embodiments, an insulating layer 1316 is further formed on the metallization layers 1314 in each device die 1310.

In addition, the interposer 1330 lying below the device dies 1310 includes a substrate 1332 (e.g., a semiconductor substrate); metallization layers 1334 (only a single one is shown) stacked on a side of the substrate 1332 facing toward the device dies 1310; and through substrate vias 1336 penetrating through the substrate 1332. In some embodiments, an insulating layer 1338 further covers the metallization layers 1334. Further, in some embodiments, conductive features 1340 are disposed on another side of the substrate 1332 as contacts of the through substrate vias 1336, and an insulating layer 1342 is formed around the conductive features 1340.

The electrical connectors 180a, 180b extend along a vertical direction between the metallization layers 1334 of the interposer 1330 and the metallization layers 1314 of each of the device dies 1310. In those embodiments where the active side of each device die 1310 is covered by the insulating layer 1316, the electrical connectors 180a, 180b may extend through the insulating layers 1316, respectively. Similarly, in those embodiments where the interposer 1330 further includes the insulating layer 1338 covering the metallization layers 1334, the electrical connectors 180a, 180b may extend through the insulating layer 1338, to reach the metallization layers 1334.

According to some embodiments, the electrical connectors 180a, 180b are included in bonding layers 1350 similar to the bonding layers 130 as described with reference to FIG. 1A and FIG. 1B. In these embodiments, polymer layers 1352 of top ones of the bonding layers 1350 respectively cover the metallization layers 1314 of one of the device dies 1310, and a polymer layer 1354 of a bottom one of the bonding layers 1350 covers the metallization layers 1334 of the interposer 1330. The polymer layers 1352 are respectively bonded with the polymer layer 1354, and the electrical connectors 180a, 180b extend through the polymer layers 1352 and portions of the polymer layer 1354 bonded with the polymer layers 1352, to establish conduction paths between each of the device dies 1310 and the interposer 1330.

In other embodiments, the electrical connectors 180a. 180b extending between the interposer 1330 and each of the device dies 1310 are secured by an underfill (not shown), rather than the polymer layers 1352, 1354. Further, the electrical connectors 180a, 180b may be both formed with the symmetry layer design as described with reference to FIG. 1B. Alternatively, as described with reference to FIG. 10, the electrical connectors 180a may be formed with the asymmetry layer design, while the electrical connectors 180b may be formed with the symmetry layer design. Moreover, the electrical connectors 180a, 180b can be deployed according to various arrangements, such as those described with reference to FIG. 11A through FIG. 11C.

In some embodiments, the interposer 1330 is further attached onto a package substrate 1360 via conductive bumps 1362. Further, conductive bumps 1364 may be disposed at a side of the package substrate 1360 facing away from the interposer 1330, and may be functioned as input/output (I/O) terminals of the semiconductor package 1300.

Figure 14:
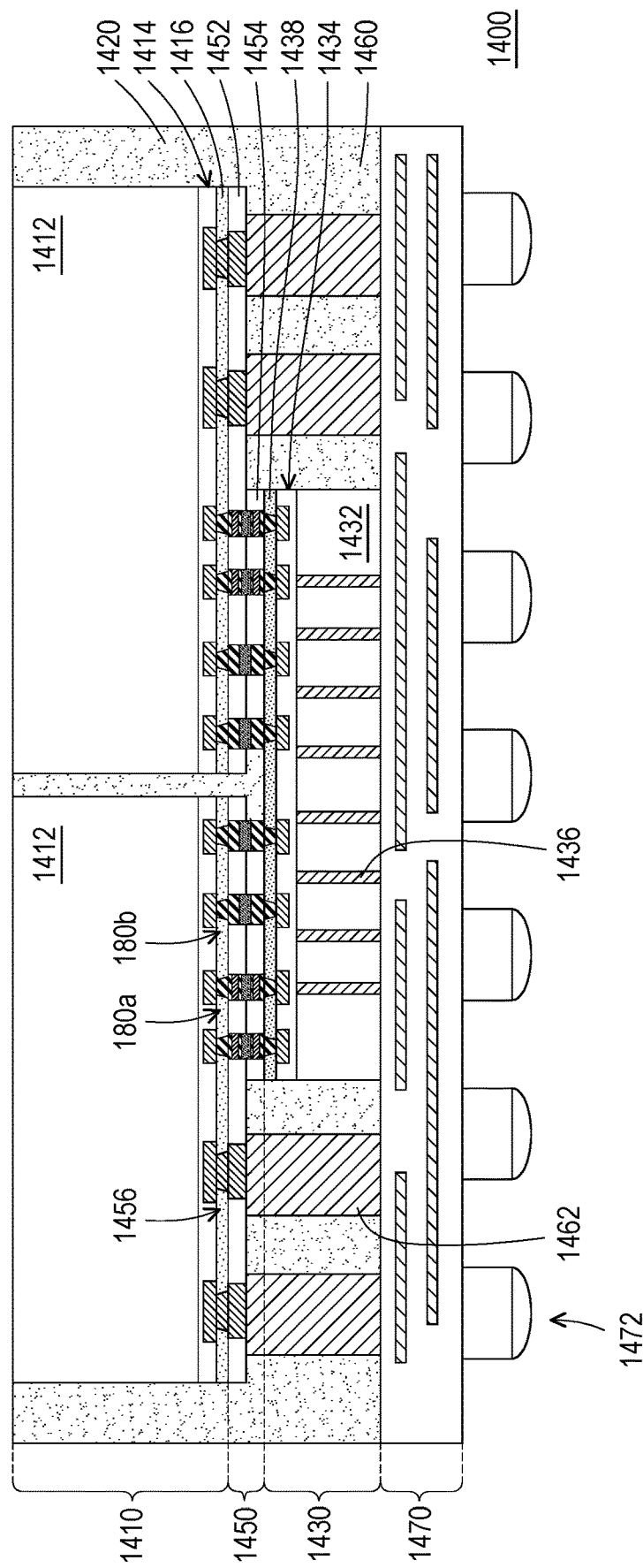

Referring to FIG. 14, the electrical connectors 180a, 180b are applied in a semiconductor package 1400. The semiconductor package 1400 includes device dies 1410 arranged side-by-side, and laterally encapsulated by an encapsulant 1420. As similar to the device die 110 described with reference to FIG. 1A, each of the device dies 1410 may include a semiconductor substrate 1412 and metallization layers 1414 (only a single one is shown) stacked on an active side of the semiconductor substrate 1412. In some embodiments, an insulating layer 1416 is further formed on the metallization layers 1414 in each device die 1410.

Further, the device dies 1410 are bonded to a bridge die 1430 lying below and extending across a gap between the device dies 1410. The bridge die 1430 includes a substrate 1432 (e.g., a semiconductor substrate) and metallization layers 1434 (only a single one is shown) stacked on a side of the substrate 1432 facing toward the device dies 1410. The device dies 1410 can be communicated through lateral conduction paths established in the metallization layers 1434. In some embodiments, the device dies 1410 are respectively routed to the other side of the bridge die 1430 via the metallization layers 1434 and through substrate vias 1436 penetrating through the substrate 1432. In addition, according to some embodiments, an insulating layer 1438 is further formed on the metallization layers 1434.

The electrical connectors 180a, 180b extend along a vertical direction between the metallization layers 1434 of the bridge die 1430 and the metallization layers 1414 of each device die 1410. In those embodiments where the active side of each device die 1410 is covered by the insulating layer 1416, the electrical connectors 180a, 180b may extend through the insulating layers 1416, respectively. Similarly, in those embodiments where the bridge die 1430 further includes the insulating layer 1438 covering the metallization layers 1434, the electrical connectors 180a, 180b may extend through the insulating layer 1438, to reach the metallization layers 1434.

According to some embodiments, the electrical connectors 180a, 180b are included in bonding layers 1450 similar to the bonding layers 130 as described with reference to FIG. 1A and FIG. 1B. In these embodiments, polymer layers 1452 of top ones of the bonding layers 1350 respectively cover the metallization layers 1414 of one of the device dies 1410, and a polymer layer 1454 of a bottom one of the bonding layers 1450 covers the metallization layers 1434 of the bridge die 1430. The polymer layers 1452 are respectively bonded with the polymer layer 1454, and the electrical connectors 180a, 180b extend through the polymer layers 1452 and portions of the polymer layer 1454 bonded with the polymer layers 1452, to establish conduction paths between each of the device dies 1410 and the bridge die 1430.

It should be appreciated that, the electrical connectors 180a, 180b may be both formed with the symmetry layer design as described with reference to FIG. 1B. Alternatively, as described with reference to FIG. 10, the electrical connectors 180a may be formed with the asymmetry layer design, while the electrical connectors 180b may be formed with the symmetry layer design. Moreover, the electrical connectors 180a, 180b can be deployed according to various arrangements, such as those described with reference to FIG. 11A through FIG. 11C.

Another encapsulant 1460 may laterally encapsulate the bridge die 1430 and the bonding layer 1450 covering the bridge die 1430, and may be in contact with the overlying encapsulant 1420 laterally encapsulating the device dies 1410 and the covered bonding layers 1450. According to some embodiments, through encapsulant vias 1462 are further formed around the bridge die 1430, and penetrate through the encapsulant 1460 in lateral contact with the bridge die 1430 and the covered bonding layer 1450. In these embodiments, contact features 1456 may be further formed in the polymer layers 1452 of the bonding layers 1450 covering the device dies 1410, and are positioned in accordance with the through encapsulant vias 1462. In this way, the device dies 1410 can be routed to an opposite side of the encapsulant 1460 not only by the electrical connectors 180a, 180b and the bridge die 140, but also by the contact features 1456 and the through encapsulant vias 1462.

In some embodiments, a redistribution structure 1470 is further formed at the side of the encapsulant 1460 facing away from the device dies 1410, for routing the through substrate vias 1436 of the bridge die 1430 and the through encapsulant vias 1462. Further, conductive bumps 1472 may be formed at another side of the redistribution structure 1470, and functioned as I/O terminals of the semiconductor package 1400.

Figure 15:
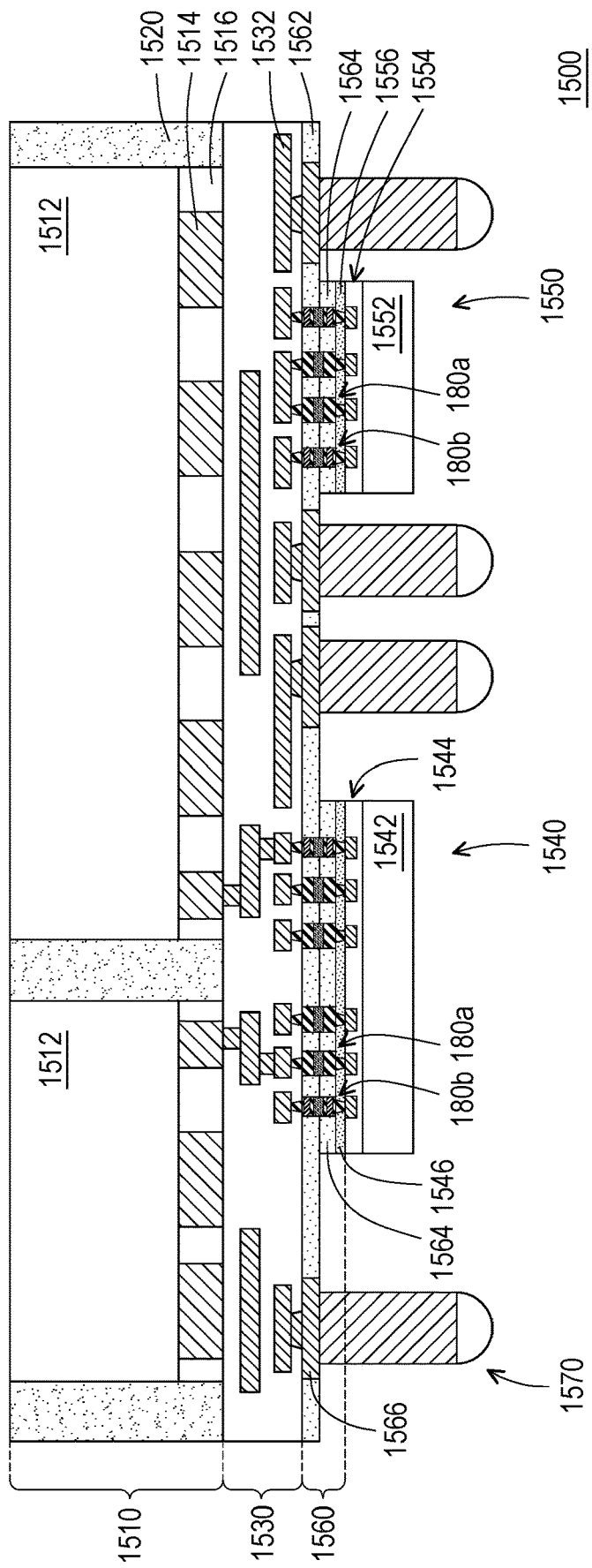

Referring to FIG. 15, the electrical connectors 180a, 180b may be applied in a fan-out semiconductor package 1500. The semiconductor package 1500 includes device dies 1510 arranged side-by-side, and laterally encapsulated by an encapsulant 1520. Each of the device dies 1510 may include a semiconductor substrate 1512, and include active devices and metallization layers (both not shown) formed on an active side of the semiconductor substrate 1512. Further, contact posts 1514 and an insulating layer 1516 surrounding the contact posts 1514 may be provided on the metallization layers (not shown) of each device die 1510, and may be laterally surrounded by the encapsulant 1520.

A redistribution structure 1530 is formed along a side of an encapsulated structure including the device dies 1510 and the encapsulant 1520. The contact posts 1514 are revealed at the side of the encapsulated structure, such that conductive features 1532 spreading in the redistribution structure 1530 can be electrically connected with the contact posts 1514, and may be configured to rout the contact posts 1514 to an opposite side of the redistribution structure 1530 via a fan-out manner.

A bridge die 1540 is attached to the side of the redistribution structure 1530 facing away from the device dies 1510 via a first group of the electrical connectors 180a, 180b, and may be overlapped with the device dies 1510. The bridge die 1540 may include a substrate 1542 (e.g., a semiconductor substrate), and metallization layers 1544 (only a single one is shown) stacked on the substrate 1542. The electrical connectors 180a, 180b in the first group extend vertically between the metallization layers 1544 of the bridge die 1540 and the redistribution structure 1530. In this way, the bridge die 1540 can be electrically connected to the contact posts 1514 of the device dies 1510 via the electrical connectors 180a, 180b in the first group and the conductive features 1532 in the redistribution structure 1530, and the device dies 1510 can be communicated through lateral conduction paths established in the metallization layers 1544 of the bridge die 1540. In some embodiments, the bridge die 1540 further includes an insulating layer 1546 covering the metallization layers 1544. In these embodiments, the electrical connectors 180a, 180b in the first group may penetrate through the insulating layer 1546, to reach the metallization layers 1544.

In addition, a passive die 1550 may also be attached to the side of the redistribution structure 1530 facing away from the device dies 1510, and may be overlapped with one of the device dies 1510. A second group of the electrical connectors 180a, 180b may be applied for connecting the passive die 1550 to the redistribution structure 1530. The passive die 1550 may include a substrate 1552 (e.g., a semiconductor substrate) and metallization layers 1554 (only a single one is shown) stacked on the substrate 1552, and the electrical connectors 180a, 180b in the second group may extend vertically between the metallization layers 1554 of the passive die 1550 and the redistribution structure 1530. In this way, the passive die 1550 can be connected to the contact posts 1514 of one of the device dies 1510 via the electrical connectors 180a, 180b in the second group and the conductive features 1532 in the redistribution structure 1530. In some embodiments, the passive die 1550 further includes an insulating layer 1556 covering the metallization layers 1554. In these embodiments, the electrical connectors 180a, 180b in the second group may penetrate through the insulating layer 1556, to reach the metallization layers 1554.

According to some embodiments, the groups of the electrical connectors 180a, 180b are included in bonding layers 1560 similar to the bonding layers 130 as described with reference to FIG. 1A and FIG. 1B. In these embodiments, a polymer layer 1562 of a top one of the bonding layers 1560 covers the side of the redistribution structure 1530 facing toward the bridge die 1540 and the passive die 1550, and polymer layers 1564 of bottom ones of the bonding layers 1560 cover the metallization layers 1544, 1554 of the bridge die 1540 and the passive die 1550. The polymer layers 1564 are respectively bonded with the polymer layer 1562, and the electrical connectors 180a, 180b extend through the polymer layers 1564 and portions of the polymer layer 1562 bonded with the polymer layers 1564, to establish conduction paths between the redistribution structure 1530 and each of the bridge die 1540 and the passive die 1550.

In those embodiments where the electrical connectors 180a, 180b are included in the bonding layers 1560, conductive bumps 1570 as I/O terminals of the semiconductor package 1500 may be formed on the polymer layer 1562 covering the redistribution structure 1530, and are connected to the redistribution structure 1530 through contact features 1566 further formed in the polymer layer 1562. The conductive bumps 1570 may be arranged around and between the bridge die 1540 and the passive device 1550, and may be greater in height as compared to the bridge die 1540 and the passive die 1550.

It should be appreciated that, the electrical connectors 180a, 180b may be both formed with the symmetry layer design as described with reference to FIG. 1B. Alternatively, as described with reference to FIG. 10, the electrical connectors 180a may be formed with the asymmetry layer design, while the electrical connectors 180b may be formed with the symmetry layer design. Moreover, the electrical connectors 180a, 180b can be deployed according to various arrangements, such as those described with reference to FIG. 11A through FIG. 11C.

Figure 16:
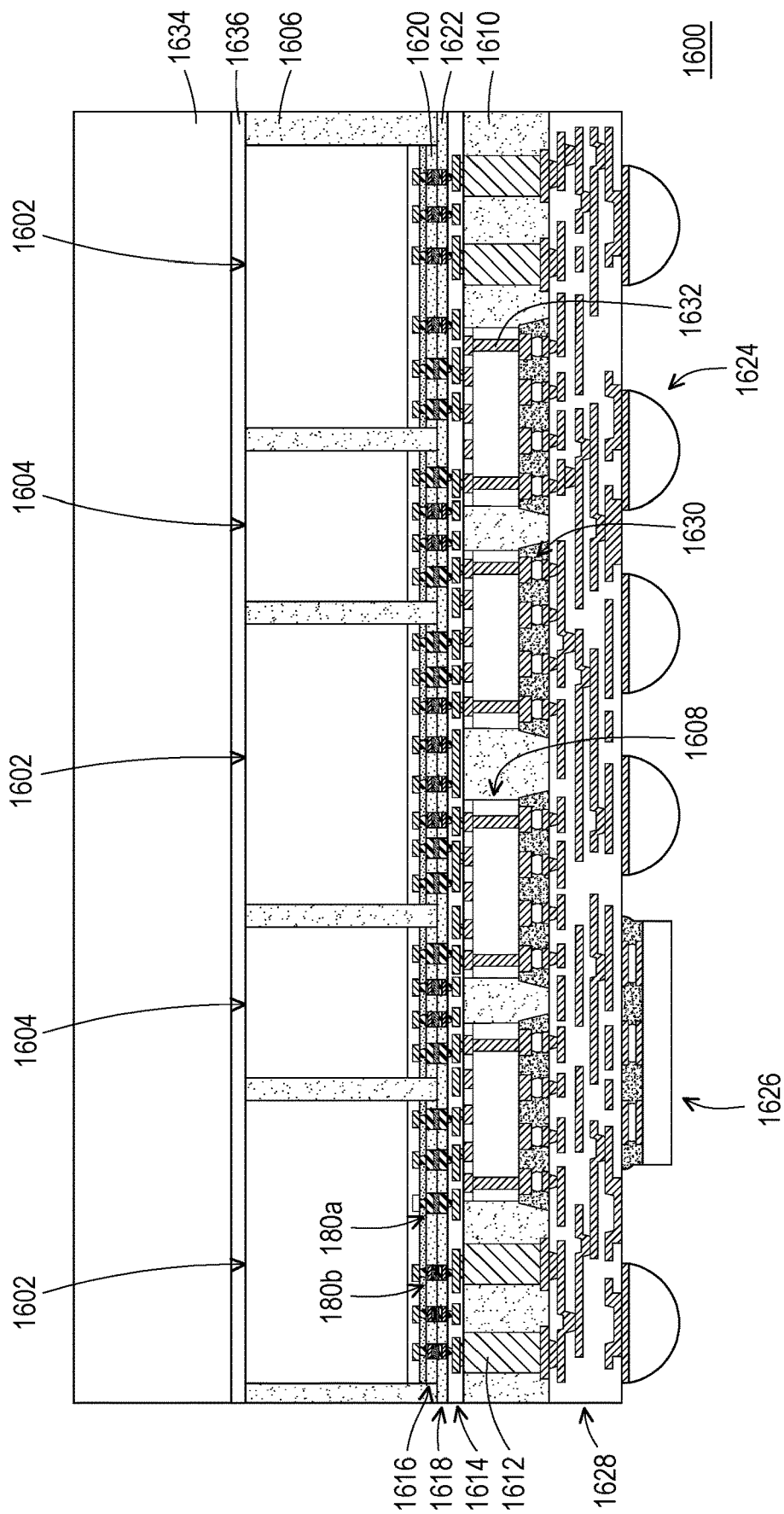

Referring to FIG. 16, the electrical connectors 180a, 180b may be applied in a more complicated semiconductor package 1600. The semiconductor package 1600 includes device dies 1602 and bridge dies 1604 arranged at a first height. Each of the bridge dies 1604 may be located between adjacent ones of the device dies 1602, and the device dies 1602 as well as the bridge dies 1604 are laterally encapsulated by an encapsulant 1606.

Further, the semiconductor package 1600 also includes device dies 1608 at a second height lower than the first height. The bridge dies 1604 at the first height may be respectively positioned to overlap adjacent ones of the device dies 1608 at the second height, and adjacent ones of the device dies 1608 at the second height may be bridged with each other through the overlapping bridge die 1604. In addition, the device dies 1608 at the second height are laterally encapsulated by another encapsulant 1610. Further, through encapsulant vias 1612 may be disposed around the device dies 1608, and penetrate through the encapsulant 1610.

The device dies 1602, 1608 may be respectively similar to the device die 110 described with reference to FIG. 1A, each of the devices 1310 described with reference to FIG. 13, each of the device dies 1410 described with reference to FIG. 14 or each of the device dies 1510 described with reference to FIG. 15. In addition, the bridge dies 1604 may be respectively similar to the bridge die 1430 described with reference to FIG. 14 or the bridge die 1540 described with reference to FIG. 15. For simplicity, details of the device dies 1602, 1608 and the bridge dies 1604 will not be described, except for some of those in related to other components.

A redistribution structure 1614 covers the device dies 1608, the encapsulant 1610 and the through encapsulant vias 1612 at the second height, and lies below the device dies 1602, the bridge dies 1604 and the encapsulant 1606 at the first height. Conductive features in the redistribution structure 1614 may be designed for routing the device dies 1608 and the through encapsulant vias 1612 at the second height. The electrical connectors 180a, 180b may stand on the redistribution structure 1614, and electrically connect the device dies 1602 and the bridge dies 1604 at the first height to the conductive features in the redistribution structure 1614. In this way, the device dies 1602 at the first height can be electrically connected to the device dies 1608 and the through encapsulant vias 1612 at the second height through the electrical connectors 180a, 180b and the conductive features in the redistribution structure 1614. In addition, the device dies 1608 at the second height can be electrically connected to the bridge dies 1604 at the first height through the electrical connectors 180a, 180b and the conductive features of the redistribution structure 1614 as well.

According to some embodiments, the electrical connectors 180a, 180b are included in bonding layers 1616, 1618 similar to the bonding layers 130 as described with reference to FIG. 1A and FIG. 1B. In these embodiments, polymer layers 1620 of the bonding layers 1616 cover the device dies 1602 and the bridge dies 1604 respectively, and are each laterally surrounded by the encapsulant 1606. In addition, a polymer layer 1622 of the bonding layer 1618 lies on the redistribution structure 1614. The polymer layers 1620 are respectively bonded with the polymer layer 1622, and the electrical connectors 180a, 180b extend through the polymer layers 1620 and portions of the polymer layer 1622 bonded with the polymer layers 1620, to establish conduction paths between the redistribution structure 1614 and each of the device dies 1602 and the bridge dies 1604.

In other embodiments, the electrical connectors 180a, 180b extending between the redistribution structure 1614 and each of the device dies 1602 and the bridge dies 1604 are secured by an underfill (not shown), rather than the polymer layers 1620, 1622. Further, the electrical connectors 180a, 180b may be both formed with the symmetry layer design as described with reference to FIG. 1B. Alternatively, as described with reference to FIG. 10, the electrical connectors 180a may be formed with the asymmetry layer design, while the electrical connectors 180b may be formed with the symmetry layer design. Moreover, the electrical connectors 180a, 180b can be deployed according to various arrangements, such as those described with reference to FIG. 11A through FIG. 11C.

In order to connect the device dies 1608 and the through encapsulant vias 1612 at the second height to conductive bumps 1624 (and a passive die 1626) at a third height lower than the first and second heights, a redistribution structure 1628 is formed along a bottom side of an encapsulated structure including the device dies 1608, the encapsulant 1610 and the through encapsulant vias 1612. The device dies 1608 may be attached onto the redistribution structure 1628 via conductive bumps 1630, while the through encapsulant vias 1612 may stand on the redistribution structure 1628. Conductive features in the redistribution structure 1628 rout the conductive bumps 1630 and the through encapsulant vias 1612 to the conductive bumps 1624 (and the passive die 1626) at the other side of the redistribution structure 1628. In this way, the device dies 1602 at the first height can be routed to the conductive bumps 1624 via the electrical connectors 180a, 180b, the redistribution structure 1614, the through encapsulant vias 1612 and the redistribution structure 1628. In addition, the device dies 1608 at the second height may be connected to the conductive bumps 1624 (and the passive die 1626) through the redistribution structure 1614, the through encapsulant vias 1612 and the redistribution structure 1628.

In some embodiments, through substrate vias 1632 are provided in at least one of the device dies 1608 at the second height. In these embodiments, the device dies 1602 at the first height may be routed to the conductive bumps 1624 (and the passive die 1626) by further conduction paths established through the electrical connectors 180a, 180b, the redistribution structure 1614, the through substrate vias 1632 in the device dies 1608 and the redistribution structure 1628. In addition, the device dies 1608 at the second height can be connected to the conductive bumps 1624 (and the passive die 1626) by further conduction paths established through the through substrate vias 1632 and the redistribution structure 1628.

Moreover, in some embodiments, an encapsulated structure including the device dies 1602, the bridge dies 1604 and the encapsulant 1606 at the first height is attached to an overlying heat dissipation substrate 1634, such as a semiconductor substrate. An adhesive layer 1636 may lie between the encapsulated structure and the heat dissipation substrate 1634, to enhance adhesion therebetween.

As above, electrical connectors with different dimensions and different layer designs are used for transmitting various signals between vertically separated package components. Specifically, a first group of the electrical connectors with a first critical width and a first pitch respectively include a pair of first metallic layers formed of a first metallic material, and include a solder joint lies between the first metallic layers. As compared to the electrical connectors in the first group, a second group of the electrical connectors with a second critical width and a second pitch, which are shorter than the first critical width and the first pitch respectively, further include second metallic layers formed of a second metallic material. As a result, the solder joint in each of the electrical connectors with shorter width and shorter pitch is in contact with a thinner layer of the first metallic material, which is a source for forming intermetallic compound causing lateral recess. Since the source resulting lateral recess is reduced, serious necking or even breaking of the electrical connectors with shorter width and shorter pitch can be effectively prevented. Therefore, reliability of the electrical connectors with shorter width and shorter pitch can be improved, and more promising communication between the package components at opposite sides of the electrical connectors can be ensured. Furthermore, during manufacturing, the electrical connectors with different dimensions and different layer designs are formed separately. In this way, sufficient thickness of upper and lower halves in each of the electrical connectors with shorter width and shorter pitch can be ensured, and joint failure for the electrical connectors with shorter width and shorter pitch can be effectively prevented.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a first device die; a second device die, stacked on the first device die; and first electrical connectors and second electrical connectors, disposed in between the first and second device dies, wherein a first pitch between the first electrical connectors is greater than a second pitch between the second electrical connectors, the first and second electrical connectors respectively comprise a solder joint and first metallic layers lying at opposite sides of the solder joint and formed of a first metallic material, and each of the second electrical connectors further comprises at least one second metallic layer formed of a second metallic material.

In another aspect of the present disclosure, a semiconductor package is provided. The semiconductor package comprises: a first device die; a second device die, stacked on the first device die; a first polymer layer, lining along a surface of the first device die; a second polymer layer, lining along a surface of the second device die, and bonded with the first polymer layer; first electrical connectors and second electrical connectors, extending through the first and second polymer layers, wherein the first and second electrical connectors respectively comprise a solder joint and first metallic layers lying at opposite sides of the solder joint and formed of a first metallic material, and each of the second electrical connectors further comprises at least one second metallic layer formed of a second metallic material; a first encapsulant, disposed on the first device die, and laterally encapsulating the second device die; and a second encapsulant, laterally surrounding the first encapsulant and the first device die.

In yet another aspect of the present disclosure, a semiconductor package is provided. The semiconductor package comprises: a first package component; a second package component, vertically spaced apart from the first package component; and first electrical connectors and second electrical connectors, disposed in between the first and second package components and connecting the first and second package components with each other, wherein a first critical width of each first electrical connector is greater than a second critical width of each second electrical connector, the first and second electrical connectors respectively comprise a solder joint and first metallic layers lying at opposite sides of the solder joint and formed of a first metallic material, and each of the second electrical connectors further comprises at least one second metallic layer formed of a second metallic material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first device die;
   a second device die, stacked on the first device die; and
   first electrical connectors and second electrical connectors, disposed in between the first and second device dies, wherein a first pitch between the first electrical connectors is greater than a second pitch between the second electrical connectors, the first and second electrical connectors respectively comprise a solder joint and first metallic layers lying at opposite sides of the solder joint and formed of a first metallic material, and each of the second electrical connectors further comprises at least one second metallic layer formed of a second metallic material.

2. The semiconductor package according to claim 1, wherein the at least one second metallic layer in each second electrical connector comprise two second metallic layers each lying between adjacent ones of the first metallic layers at one side of the solder joint, and the first metallic layers in each of the second electrical connectors are respectively thinner than each first metallic layer in each of the first electrical connectors.

3. The semiconductor package according to claim 1, wherein the at least one second metallic layer in each second electrical connector comprise a single second metallic layer lying between adjacent ones of the first metallic layers at a side of the solder joint, and the first metallic layers at the side of the solder joint in each of the second electrical connectors are respectively thinner than each first metallic layer in each of the first electrical connectors.

4. The semiconductor package according to claim 1, wherein the first metallic material comprises copper, and the second metallic material comprises nickel, cobalt, iron or combinations thereof.

5. The semiconductor package according to claim 1, wherein each of the first and second electrical connectors further comprise seed layers at opposite ends.

6. The semiconductor package according to claim 1, further comprising:
   a first polymer layer, lining along a surface of the first device die; and
   a second polymer layer, lining along a surface of the second device die, and bonded with the first polymer layer, wherein the first and second electrical connectors extend through the first and second polymer layers.

7. The semiconductor package according to claim 1, further comprising:
   an underfill, filled in between the first and second device dies, and laterally surrounding the first and second electrical connectors.

8. The semiconductor package according to claim 1, wherein each of the first and second electrical connectors has an upper half and a lower half narrower than the upper half.

9. The semiconductor package according to claim 1, wherein a first critical width of each first electrical connector is greater than a second critical width of each second electrical connector.

10. The semiconductor package according to claim 1, wherein the second electrical connectors are arranged around an array of the first electrical connectors.

11. The semiconductor package according to claim 1, wherein the second electrical connectors are surrounded by the first electrical connectors.

12. A semiconductor package, comprising:
a first device die;
a second device die, stacked on the first device die;
a first polymer layer, disposed on a surface of the first device die;
a second polymer layer, disposed on a surface of the second device die, and bonded with the first polymer layer;
first electrical connectors and second electrical connectors, extending through the first and second polymer layers, wherein the first and second electrical connectors respectively comprise a solder joint and first metallic layers lying at opposite sides of the solder joint and formed of a first metallic material, and each of the second electrical connectors further comprises at least one second metallic layer formed of a second metallic material;
a first encapsulant, disposed on the first device die, and laterally encapsulating the second device die; and
a second encapsulant, laterally surrounding the first encapsulant and the first device die.

13. The semiconductor package according to claim 12, wherein the first device die comprises:
a semiconductor substrate;
front metallization layers, lying along an active side of the semiconductor substrate;
back metallization layers, lying along a back side of the semiconductor substrate; and
through substrate vias, penetrating through the semiconductor substrate,
wherein the first and second electrical connectors stand on the back metallization layers.

14. The semiconductor package according to claim 12, wherein the first device die comprises:
a semiconductor substrate;
front metallization layers, lying along an active side of the semiconductor substrate; and
through substrate vias, penetrating through at least a portion of the semiconductor substrate,
wherein the first and second electrical connectors are located on the front metallization layers.

15. The semiconductor package according to claim 12, further comprising:
a first redistribution structure, lying below the second encapsulant and the first device die; and
conductive bumps, disposed at a bottom side of the first redistribution structure.

16. The semiconductor package according to claim 15, further comprising:
through encapsulant vias, standing on the first redistribution structure around the first encapsulant and the first device die, and penetrating through at least a portion of the second encapsulant; and
a second redistribution structure, lying on the second encapsulant, the through encapsulant vias, the first encapsulant and the second device die.

17. A semiconductor package, comprising:
a first package component;
a second package component, vertically spaced apart from the first package component; and
first electrical connectors and second electrical connectors, disposed in between the first and second package components and connecting the first and second package components with each other, wherein a first critical width of each first electrical connector is greater than a second critical width of each second electrical connector, the first and second electrical connectors respectively comprise a solder joint and first metallic layers lying at opposite sides of the solder joint and formed of a first metallic material, and each of the second electrical connectors further comprises at least one second metallic layer formed of a second metallic material.

18. The semiconductor package according to claim 17, wherein a first pitch between the first electrical connectors is greater than a second pitch between the second electrical connectors.

19. The semiconductor package according to claim 17, wherein the first package component is a device die, and the second package component is another device die, an interposer, a bridge die or a redistribution structure.

20. The semiconductor package according to claim 17, wherein the first package component is a bridge die or a passive die, and the second package component is a redistribution structure.

* * * * *